(12) United States Patent
Tanaka

(10) Patent No.: US 11,316,041 B2
(45) Date of Patent: Apr. 26, 2022

(54) SEMICONDUCTOR DEVICE

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 165 days.

(21) Appl. No.: 16/765,107

(22) PCT Filed: Nov. 13, 2018

(86) PCT No.: PCT/JP2018/041985
§ 371 (c)(1),
(2) Date: May 18, 2020

(87) PCT Pub. No.: WO2019/098193
PCT Pub. Date: May 23, 2019

(65) Prior Publication Data
US 2020/0350428 A1 Nov. 5, 2020

(30) Foreign Application Priority Data

Nov. 20, 2017 (JP) .............................. JP2017-222781

(51) Int. Cl.
H01L 29/778 (2006.01)
H01L 23/535 (2006.01)
H01L 29/20 (2006.01)

(52) U.S. Cl.
CPC ........ *H01L 29/7787* (2013.01); *H01L 23/535* (2013.01); *H01L 29/2003* (2013.01)

(58) Field of Classification Search
None
See application file for complete search history.

(56) References Cited

U.S. PATENT DOCUMENTS

2006/0273347 A1 12/2006 Hikita et al.
2014/0008661 A1* 1/2014 Iwami ................... H01L 29/155
257/76

(Continued)

FOREIGN PATENT DOCUMENTS

JP 2006339561 12/2006
JP 2008258419 10/2008

(Continued)

OTHER PUBLICATIONS

International Preliminary Report on Patentability issued for International Patent Application No. PCT/JP2018/041985, dated Jun. 4, 2020, 13 pages including English translation.

(Continued)

*Primary Examiner* — Grant S Withers
(74) *Attorney, Agent, or Firm* — Hamre, Schumann, Mueller & Larson, P.C.

(57) ABSTRACT

A semiconductor device (1) includes a substrate (2), an electron transit layer (4) disposed on the substrate (2), and an electron supply layer (5) disposed on the electron supply layer (4). The electron transit layer (4) includes a conductive path forming layer (43) in contact with the electron supply layer (5), a first semiconductor region (first nitride semiconductor layer) (41) containing an acceptor-type impurity, and a second semiconductor region (second nitride semiconductor layer) (42) disposed at a position closer to the conductive path forming layer (43) than the first semiconductor region (41) and containing an acceptor-type impurity. The first semiconductor region (41) has a higher acceptor density than the second semiconductor region (42).

14 Claims, 14 Drawing Sheets

(56) References Cited

U.S. PATENT DOCUMENTS

| | | |
|---|---|---|
| 2017/0047412 A1 | 2/2017 | Tanaka et al. |
| 2017/0104091 A1* | 4/2017 | Tanaka .............. H01L 29/66431 |
| 2017/0278934 A1 | 9/2017 | Kajiwara et al. |
| 2019/0020318 A1* | 1/2019 | Ishiguro .............. H01L 29/7787 |

FOREIGN PATENT DOCUMENTS

| | | |
|---|---|---|
| JP | 5064824 | 10/2012 |
| JP | 2013065612 | 4/2013 |
| JP | 2013069772 | 4/2013 |
| JP | 2017037967 | 2/2017 |
| JP | 2017073506 | 4/2017 |
| JP | 2017174937 | 9/2017 |

OTHER PUBLICATIONS

International Search Report and Written Opinion issued for International Patent Application No. PCT/JP2018/041985, dated Feb. 5, 2019, 9 pages including English translation of Search Report.

* cited by examiner

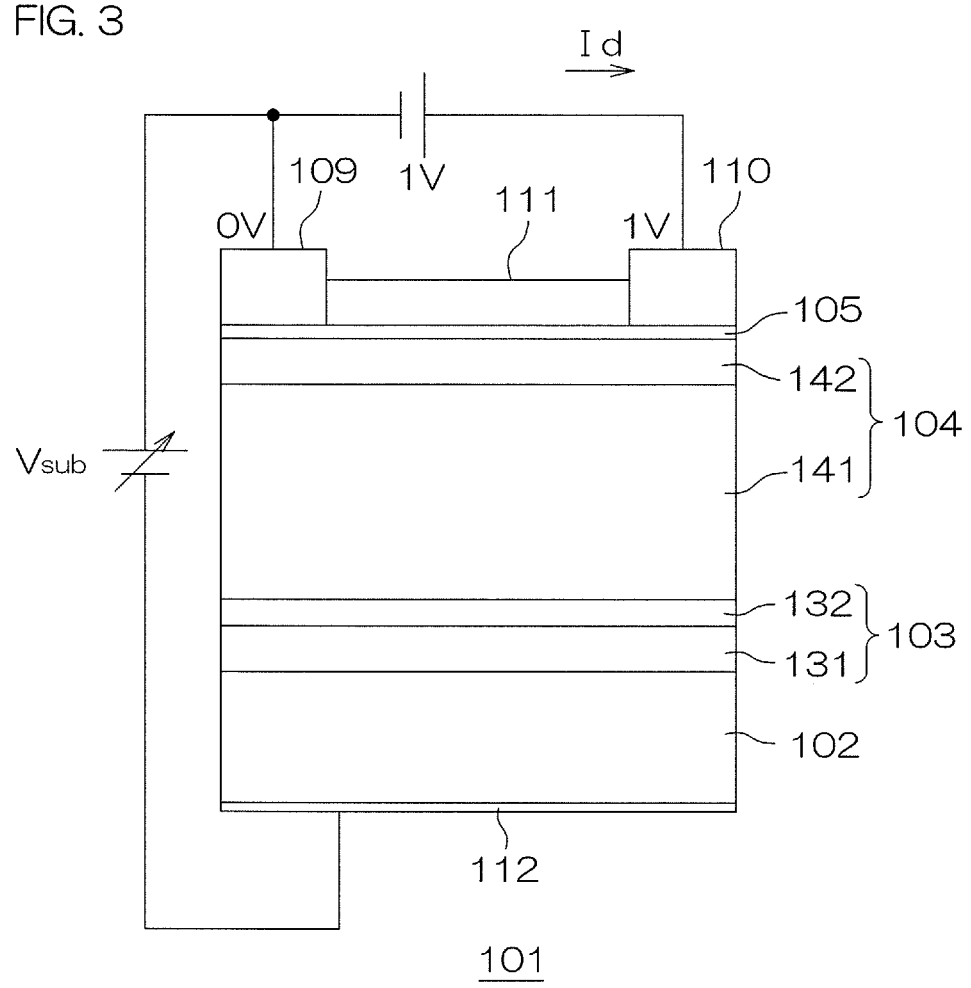

FIG. 8
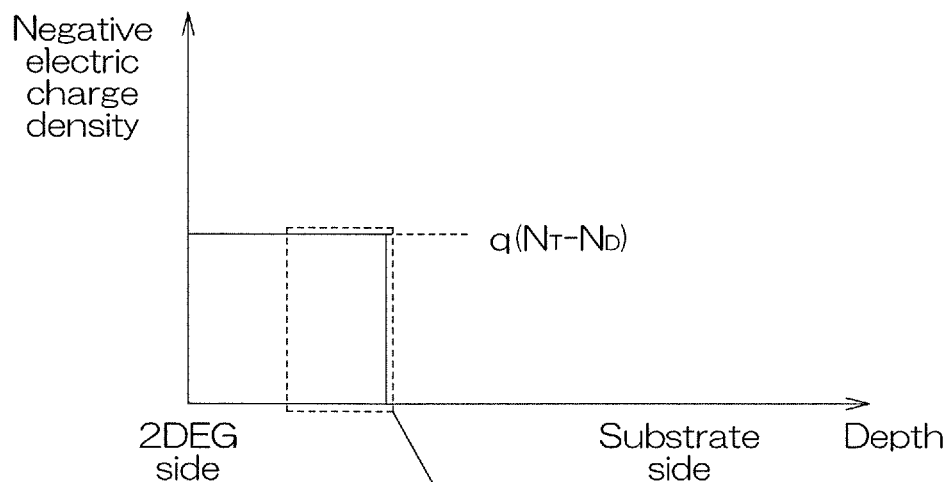
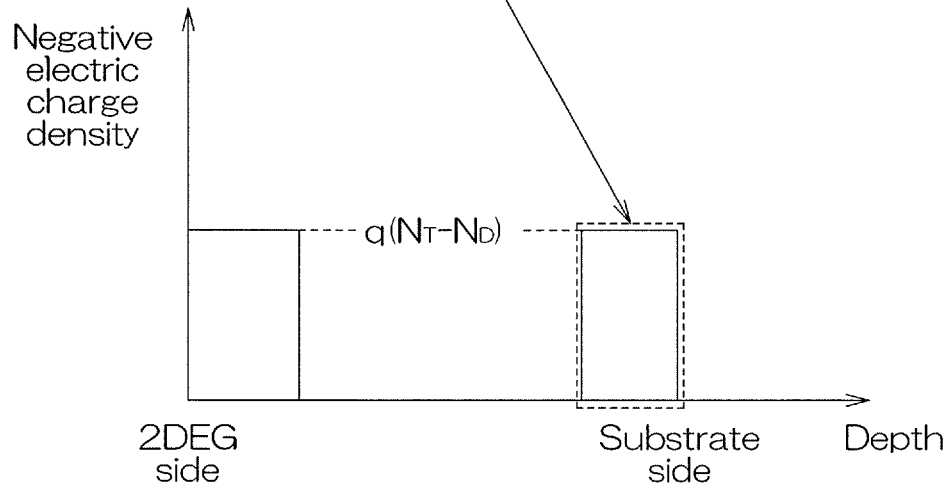

FIG. 12
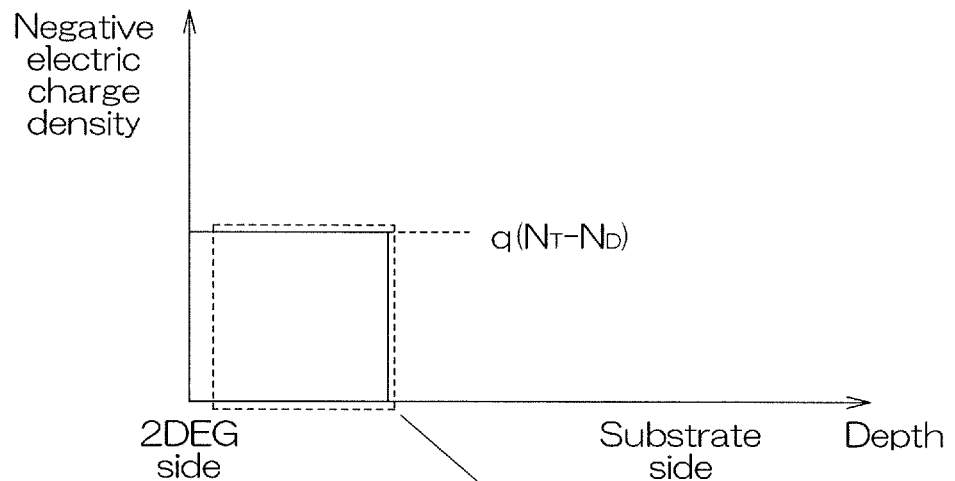
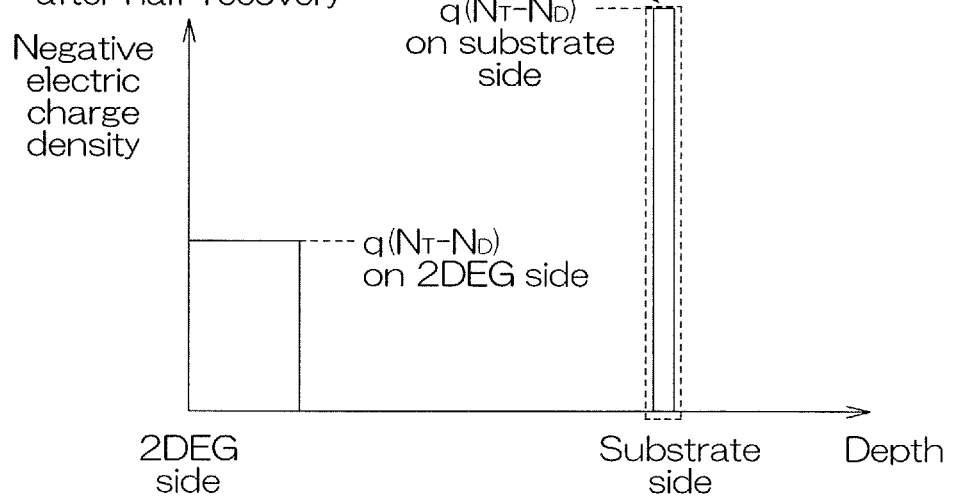

SEMICONDUCTOR DEVICE

TECHNICAL FIELD

The present invention relates to a semiconductor device such as a nitride semiconductor device made of a group-III nitride semiconductor (sometimes simply referred to as a "nitride semiconductor" hereinafter).

BACKGROUND ART

A group-III nitride semiconductor is a semiconductor using nitrogen as a V-group element in III-V group semiconductors. Typical examples of such semiconductors include aluminum nitrogen (AlN), gallium nitrogen (GaN), and indium nitrogen (InN). In general, such semiconductors can be expressed as $Al_xIn_yGa_{1-x-y}N$ ($0 \leq x \leq 1$, $0 \leq y \leq 1$, $0 \leq x+y \leq 1$).

A high electron mobility transistor (HEMT) using such a nitrogen semiconductor has been proposed. Such a HEMT includes, for example, an electron transit layer made of GaN and an electron supply layer made of AlGaN epitaxially grown on the electron transit layer. A pair of a source electrode and a drain electrode are formed in contact with the electron supply layer, and a gate electrode is disposed between these electrodes. The gate electrode is disposed so as to oppose the electron supply layer through an insulating film. The polarization caused by the lattice mismatch between GaN and AlGaN forms a two-dimensional electron gas at a position several Å inward from the interface between the electron transit layer and the electron supply layer in the electron transit layer. The source and the drain are connected to each other through this two-dimensional electron gas as a channel. When the two-dimensional electron gas is shut down by applying a control voltage to the gate electrode, the source-drain path is shut down. When no control voltage is applied to the gate electrode, the source-drain path is rendered conductive. Accordingly, this transistor operates as a normally ON device.

Devices using nitrogen semiconductors have properties such as high breakdown voltage, high temperature operation, large current density, fast switching, and low ON resistance, and hence have been studied for application to power devices.

In order to use such a device as a power device, however, the device needs to be a normally OFF device that shuts off a current at zero bias. For this reason, the HEMI described above cannot be applied to power devices.

For example, Patent Literature 1 or 2 has proposed a structure for realizing a normally OFF nitrogen semiconductor HEMI.

Patent Literature 1 discloses an arrangement designed to achieve normally OFF operation by laminating a p-type GaN layer on an AlGaN electron supply layer, disposing a gate electrode on the p-type GaN layer, and eliminating a channel by forming a depletion layer expanding from the p-type GaN layer.

According to Patent Literature 2, an oxide film having an interface continuing to the interface between the electron supply layer and the electron transit layer is formed on the electron transit layer. The gate electrode opposes the electron transit layer with the oxide film being interposed between them. In this arrangement, since the electron supply layer does not exist directly under the gate electrode, no two-dimensional electron gas is formed directly under the gate electrode. Thereby, normally OFF operation is achieved. The oxide film is formed by, for example, thermally oxidizing part of the electron supply layer.

CITATION LIST

Patent Literature

Patent Literature 1: Japanese Patent Application Laid-Open No. 2006-339561

Patent Literature 2: Japanese Patent Application Laid-Open No. 2013-65612

SUMMARY OF INVENTION

Technical Problem

As a problem of a device using a nitrogen semiconductor, a current collapse exists. Current collapse is a phenomenon in which when a large-current and high-voltage stress is applied to the device, the channel resistance increases, and the drain current decreases (ON resistance increases).

An object of the present invention is to provide a semiconductor device that can suppress current collapse.

Solution to Problem

According to a preferred embodiment of the present invention, a semiconductor device includes a substrate, an electron transit layer disposed on the substrate, and an electron supply layer disposed on the electron transit layer, the electron transit layer includes a conductive path forming layer in contact with the electron supply layer, a first semiconductor region containing an acceptor-type impurity, and a second semiconductor region disposed at a position closer to the conductive path forming layer than the first semiconductor region and containing an acceptor-type impurity. The first semiconductor region has a higher acceptor density than the second semiconductor region.

This arrangement can increase the recovery amount of drain current reduced by current collapse, and hence can suppress current collapse.

According to a preferred embodiment of the present invention, a semiconductor device includes a substrate, an electron transit layer disposed on the substrate, and an electron supply layer disposed on the electron transit layer, the electron transit layer includes a conductive path forming layer in contact with the electron supply layer, a first semiconductor region containing an acceptor-type impurity, and a second semiconductor region disposed at a position closer to the conductive path forming layer than the first semiconductor region and containing an acceptor-type impurity. The first semiconductor region has a smaller energy difference between an acceptor level and a valence band upper end than an energy difference between an acceptor level and a valence band upper end of the second semiconductor region.

This arrangement can shorten the recovery time for a drain current reduced by current collapse, and hence can suppress current collapse.

According to a preferred embodiment of the present invention, a semiconductor device includes a substrate, an electron transit layer disposed on the substrate, and an electron supply layer disposed on the electron transit layer, the electron transit layer includes a conductive path forming layer in contact with the electron supply layer, a first semiconductor region containing an acceptor-type impurity, and a second semiconductor region disposed at a position closer to the conductive path forming layer than the first semiconductor region and containing an acceptor-type impurity, the first semiconductor region has a higher acceptor density than the second semiconductor region. The first semiconductor region has a smaller energy difference between an acceptor level and a valence band upper end than an energy difference between an acceptor level and a valence band upper end of the second semiconductor region.

This arrangement can increase the recovery amount of drain current reduced by current collapse and shorten the recovery time for the drain current, and hence can more effectively suppress current collapse.

According to a preferred embodiment of the present invention, the first semiconductor region is disposed on the substrate, and the second semiconductor region is formed on a front surface of the first semiconductor region which is located on an opposite side to the substrate.

According to a preferred embodiment of the present invention, a two-dimensional electron gas is formed in the conductive path forming layer.

According to a preferred embodiment of the present invention, the first semiconductor region and the second semiconductor region each are made of a semiconductor having a semi-insulating property.

According to a preferred embodiment of the present invention, the first semiconductor region is doped with at least one type of acceptor-type impurity of Mg and Zn, and the second semiconductor region is doped with at least one type of acceptor-type impurity of C and Fe.

According to a preferred embodiment of the present invention, the first semiconductor region and the second semiconductor region each are made of a nitride semiconductor, and the electron supply layer is made of a nitride semiconductor including Al.

According to a preferred embodiment of the present invention, the semiconductor device further includes a source, a gate, and a drain disposed on the electron supply layer, and the substrate is electrically connected to the source.

The above and other objects, features, and effects of the present invention will be apparent from the following description of the preferred embodiments described next with reference to the accompanying drawings.

BRIEF DESCRIPTION OF DRAWINGS

FIG. 3 is a sectional view showing the arrangement of a semiconductor device used to check a half-recovery phenomenon concerning current collapse.

FIG. 8 is graphs each showing negative electric charge density with respect to the depth of an electron transit layer.

FIG. 12 is graphs each showing negative electric charge density with respect to the depth of an electron transit layer when $(N_T-N_D)$ of a first nitride semiconductor layer on the substrate side is large.

DESCRIPTION OF EMBODIMENTS

Figure 1:
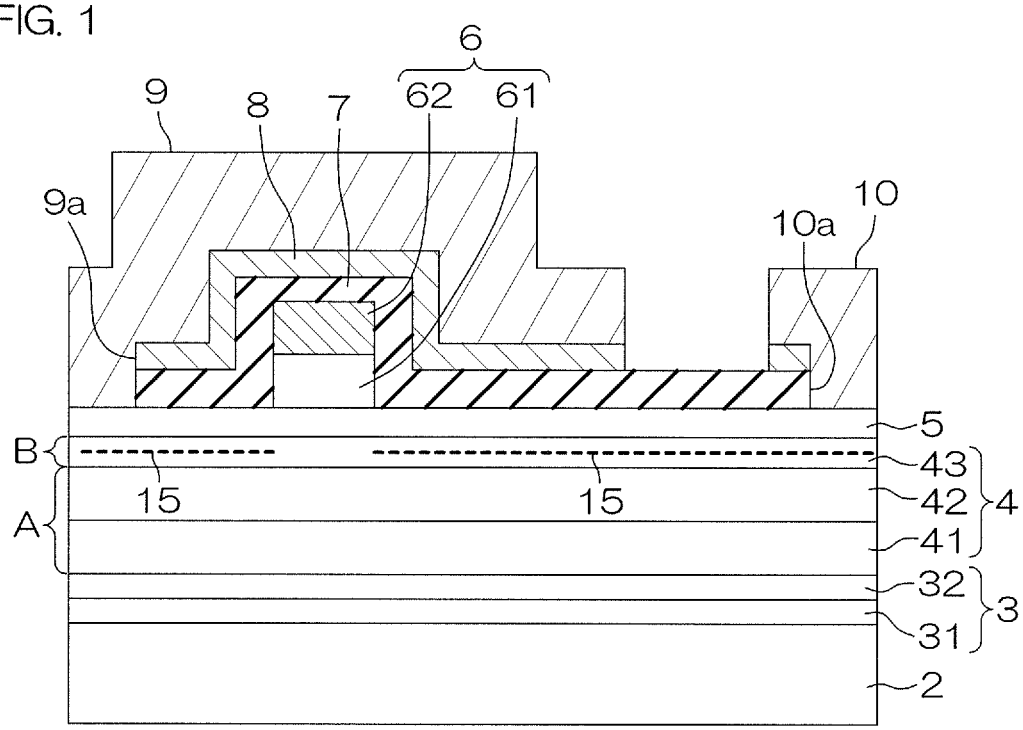
FIG. 1 is a sectional view for explaining the arrangement of a semiconductor device according to a preferred embodiment of the present invention.

FIG. 1 is a sectional view for explaining the arrangement of a semiconductor device according to a preferred embodiment of the present invention.

A semiconductor device 1 includes a substrate 2, a buffer layer 3 formed on the front surface of the substrate 2, an electron transit layer 4 formed from a nitride semiconductor layer epitaxially grown on the buffer layer 3, an electron supply layer 5 formed from a nitride semiconductor layer epitaxially grown on the electron transit layer 4, and a gate portion 6 formed on the electron supply layer 5. The gate portion 6 includes a nitride semiconductor layer 61 epitaxially grown on the electron supply layer 5 and a gate electrode 62 formed on the nitride semiconductor layer 61.

The semiconductor device 1 further includes a passivation film 7 covering the electron supply layer 5 and the gate portion 6 and a barrier metal film 8 laminated on the passivation film 7. The semiconductor device 1 further includes a source electrode 9 and a drain electrode 10 which are in ohmic contact with the electron supply layer 5 penetrating through a source electrode contact hole 9a and a drain electrode contact hole 10a formed in a laminated film of the passivation film 7 and the barrier metal film 8. The source electrode 9 and the drain electrode 10 are disposed at an interval. The source electrode 9 is formed so as to cover the gate portion 6.

The substrate 2 may be, for example, a low-resistance silicon substrate. The low-resistance silicon substrate may have an impurity concentration of, for example, $1\times10^{17}$ cm$^{-3}$ to $1\times10^{20}$ cm$^{-3}$ (more specifically, about $1\times10^{18}$ cm$^{-3}$). The substrate 2 may be a low-resistance GaN substrate, low-resistance SiC substrate, etc., instead of a low-resistance silicon substrate. The substrate 2 is electrically connected to the source electrode 9.

The buffer layer 3 is formed from a multilayer buffer layer formed by laminating a plurality of nitride semiconductor films. In this preferred embodiment, the buffer layer 3 is constituted by a first buffer layer 31 formed from an AlN film in contact with the front surface of the substrate 2 and a second buffer layer 32 formed from an AlGaN film laminated on the front surface of the first buffer layer 31 (a front surface on the opposite side to the substrate 2). The first buffer layer 31 has a film thickness of, for example, 0.2 μm. The second buffer layer 32 has a film thickness of, for example, 0.12 μm. The buffer layer 3 may be formed from, for example, a single AlN film.

The electron transit layer 4 is formed from a high impurity concentration layer A formed on the buffer layer 3 and a low impurity concentration layer B which is formed on the high impurity concentration layer A and in which a two-dimensional electron gas 15 is formed. The upper surface of the low impurity concentration layer B is in contact with the lower surface of the electron supply layer 5. The low impurity concentration layer B is sometimes referred to as a conductive path forming layer or two-dimensional electron gas formation layer hereinafter.

The high impurity concentration layer A is a semiconductor layer containing a large amount of acceptor impurity. In contrast to this, the low impurity concentration layer B is a semiconductor layer containing almost no acceptor impurity. The high impurity concentration layer A has an acceptor-type impurity concentration of $1 \times 10^{17}$ cm$^{-3}$ or more. The low impurity concentration layer B has an acceptor-type impurity concentration of less than $1 \times 10^{17}$ cm$^{-3}$.

In this preferred embodiment, the high impurity concentration layer A is constituted by a first nitride semiconductor layer 41 and a second nitride semiconductor layer 42 epitaxially grown on the first nitride semiconductor layer 41. In this preferred embodiment, the low impurity concentration layer B is formed from a third nitride semiconductor layer 43 epitaxially grown on the second nitride semiconductor layer 42.

In this preferred embodiment, the first nitride semiconductor layer 41 and the second nitride semiconductor layer 42 each correspond to a semiconductor region containing an acceptor-type impurity according to the present invention. The second nitride semiconductor layer 42 is disposed closer to the conductive path forming layer 43 (low impurity concentration layer B) than the first nitride semiconductor layer 41. Accordingly, in this preferred embodiment, the first nitride semiconductor layer 41 corresponds to the first semiconductor region according to the present invention, and the second nitride semiconductor layer 42 corresponds to the second semiconductor region according to the present invention.

In this preferred embodiment, the first nitride semiconductor layer 41 is formed from a GaN layer doped with an acceptor-type impurity, and has a thickness of about 0.5 μm to 2.0 μm. The acceptor-type impurity includes, for example, at least one type of impurity of magnesium (Mg) and zinc (Zn). The acceptor-type impurity has a concentration of, for example, about $1 \times 10^{18}$ cm$^{-3}$ to $1 \times 10^{20}$ m$^{-3}$.

In this preferred embodiment, the second nitride semiconductor layer 42 is formed from a GaN layer doped with an acceptor-type impurity, and has a thickness of about 1.0 μm to 2.0 μm. The acceptor-type impurity includes, for example, at least one type of impurity of carbon (C) and iron (Fe). The acceptor-type impurity has a concentration of, for example, about $1 \times 10^{17}$ cm$^{-3}$ to $1 \times 10^{18}$ cm$^{-3}$.

In this preferred embodiment, the third nitride semiconductor layer (conductive path forming layer) 43 is formed from a GaN layer slightly doped with an acceptor-type impurity, and has a thickness of about 0.1 μm. In this preferred embodiment, the acceptor-type impurity is, for example, carbon (C). In this preferred embodiment, the acceptor-type impurity of the third nitride semiconductor layer 43 has a concentration of, for example, about $1 \times 10^{16}$ cm$^{-3}$.

An acceptor density $N_T$ of the first nitride semiconductor layer 41 is preferably higher than the acceptor density $N_T$ of the second nitride semiconductor layer 42. In other words, a difference ($N_T$–$N_D$) between the acceptor density $N_T$ and a donor density $N_D$ of the first nitride semiconductor layer 41 is preferably larger than the difference ($N_T$–$N_D$) between the acceptor density $N_T$ and the donor density $N_D$ of the second nitride semiconductor layer 42. This is because this can increase the recovery amount of drain current reduced by current collapse. This reason will be described in detail later.

A difference ($E_T$–$E_V$) between an acceptor level $E_T$ and a valence band upper end energy $E_V$ of the first nitride semiconductor layer 41 is preferably smaller than the difference ($E_T$–$E_V$) between the acceptor level $E_T$ and the valence band upper end energy $E_V$ of the second nitride semiconductor layer 42. This is because this can shorten the recovery time for drain current reduced by current collapse. This reason will be described in detail later.

It is more preferable that the difference ($N_T$–$N_D$) between the acceptor density $N_T$ and the donor density $N_D$ of the first nitride semiconductor layer 41 is larger than that of the second nitride semiconductor layer 42, and the difference ($E_T$–$E_V$) between the acceptor level $E_T$ and the valence band upper end energy $E_V$ of the first nitride semiconductor layer 41 is smaller than that of the second nitride semiconductor layer 42. This is because this can increase the recovery amount of drain current reduced by current collapse and can also shorten the recovery time for drain current reduced by current collapse. This reason will be described in detail later.

The electron supply layer 5 is formed from a nitride semiconductor having a larger band gap than the electron transit layer 4. Specifically, the electron supply layer 5 is formed from a nitride semiconductor having a higher Al composition than the electron transit layer 4. A nitride semiconductor having a higher Al composition has a larger band gap. In this preferred embodiment, the electron supply layer 5 is formed from $Al_{x1}Ga_{1-x1}N$ layer (0<x1<1), and has a thickness of about 10 nm. The electron supply layer 5 preferably has a film thickness of 10 nm or more and 20 nm or less.

As described above, the electron transit layer 4 and the electron supply layer 5 are made of nitride semiconductors having different band gaps (Al compositions), and lattice mismatch occurs between these layers. The energy level of the conductive band of the electron transit layer 4 at the interface between the electron transit layer 4 and the electron supply layer 5 is lower than the Fermi level due to the spontaneous polarization of the electron transit layer 4 and the electron supply layer 5 and the piezoelectric polarization caused by lattice mismatch between these layers. This causes the two-dimensional electron gas (2DEG) 15 to expand at a position near the interface between the electron transit layer 4 and the electron supply layer 5 (for example, at a distance of about several Å from the interface) in the third nitride semiconductor layer 43.

The nitride semiconductor layer 61 forming part of the gate portion 6 is made of a nitride semiconductor doped with an acceptor-type impurity. In this preferred embodiment, the nitride semiconductor layer 61 is formed from a GaN layer (p-type GaN layer) doped with an acceptor-type impurity, and has a thickness of about 60 nm. The acceptor-type impurity preferably has a concentration of $3 \times 10^{17}$ cm$^{-3}$ or more. In this preferred embodiment, the acceptor-type impurity is magnesium (Mg). The acceptor-type impurity may be an acceptor-type impurity other than Mg, such as carbon (C). The nitride semiconductor layer 61 is provided to offset the two-dimensional electron gas 15 formed in the interface between the electron transit layer 4 and the electron supply layer 5 in a region directly under the gate portion 6.

The gate electrode 62 is formed in contact with the nitride semiconductor layer 61. In this preferred embodiment, the gate electrode 62 is formed from a TiN layer, and has a thickness of about 100 nm. The gate electrode 62 is disproportionately disposed biasedly toward the source electrode contact hole 9a.

The passivation film 7 covers the front surface of the electron supply layer 5 (excluding regions which the contact holes 9a and 10 oppose), the side surfaces of the nitride semiconductor layer 61, and the side surfaces and the front surface of the gate electrode 62. In this preferred embodiment, the passivation film 7 is formed from a Sin film, and has a thickness of about 100 nm.

The barrier metal film 8 is laminated on the passivation film 7 so as to cover the gate portion 6. In this preferred embodiment, the barrier metal film 8 is formed from a TiN film, and has a thickness of about 50 nm.

The source electrode 9 and the drain electrode 10 each may have a lower layer in contact with the electron supply layer 5, an intermediate layer laminated on the lower layer, and an upper layer laminated on the intermediate layer. The lower layer may be a Ti layer having a thickness of about 20 nm. The intermediate layer may be an Al layer having a thickness of 200 nm. The upper layer may be a TiN layer having a thickness of about 50 nm.

The semiconductor device 1 has a hetero junction formed by forming, on the electron transit layer 4, the electron supply layer 5 having a band gap (Al composition) different from that of the electron transit layer 4. This forms the two-dimensional electron gas 15 in the electron transit layer 4 near the interface between the electron transit layer 4 and the electron supply layer 5, and forms a HEMI using the two-dimensional electron gas 15 as a channel. The gate electrode 62 opposes the electron supply layer 5 through the nitride semiconductor layer 61 formed from a p-type GaN layer. At a position below the gate electrode 62, the ionized acceptor contained in the nitride semiconductor layer 61 formed from a p-type GaN layer raises the energy levels of the electron transit layer 4 and the electron supply layer 5, thereby increasing the energy level of the conductive band in the hetero junction interface above the Fermi level. Accordingly, this inhibits the formation of the two-dimensional electron gas 15, directly under the gate electrode 62 (gate portion 6), due to the spontaneous polarization of the electron transit layer 4 and the electron supply layer 5 and the piezoelectric polarization caused by the lattice mismatch between them. Therefore, when no bias is applied to the gate electrode 62 (at zero bias), the channel formed by the two-dimensional electron gas 15 is shut down directly under the gate electrode 62. This realizes a normally OFF HEMI. When a proper ON voltage (for example, 3 V) is applied to the gate electrode 62, a channel is induced in the electron transit layer 4 directly under the gate electrode 62 to connect the two-dimensional electron gases 15 on both sides of the gate electrode 62. This renders the source-drain path conductive.

At the time of use, for example, a predetermined voltage (for example, 200 V to 300 V) at which the drain electrode 10 side becomes positive is applied between the source electrode 9 and the drain electrode 10. In this state, an OFF voltage (0 V) or an ON voltage (3 V) is applied to the gate electrode 62, with the source electrode 12 being set to a reference potential (0 V).

FIGS. 2A to 2G are sectional views for explaining an example of a manufacturing process for the semiconductor device 1 described above, and show sectional structures in a plurality of steps in the manufacturing process.

Figure 2A:
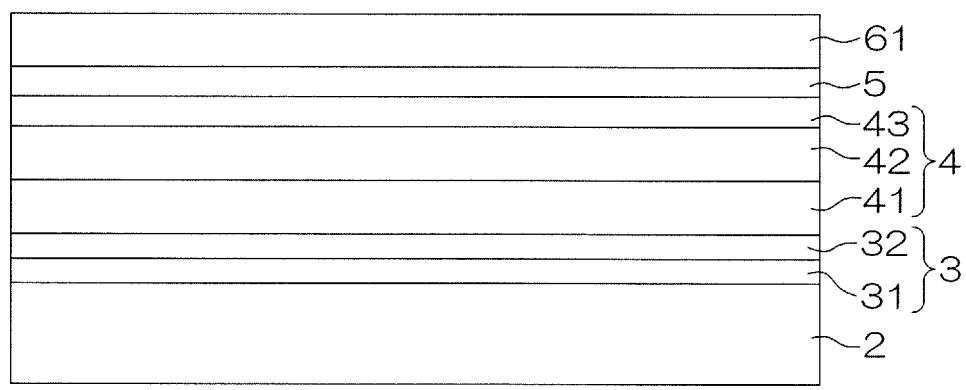
FIG. 2A is a sectional view showing an example of a manufacturing step for the semiconductor device.

First of all, as shown in FIG. 2A, the buffer layer 3 is epitaxially grown on the substrate 2. In addition, the first nitride semiconductor layer 41, the second nitride semiconductor layer 42, and the third nitride semiconductor layer 43 constituting the electron transit layer 4 are sequentially epitaxially grown on the buffer layer 3. Furthermore, a nitride semiconductor layer forming the electron supply layer 5 is epitaxially grown on the third nitride semiconductor layer 43. The nitride semiconductor layer 61 is also epitaxially grown on the electron supply layer 5.

Figure 2B:
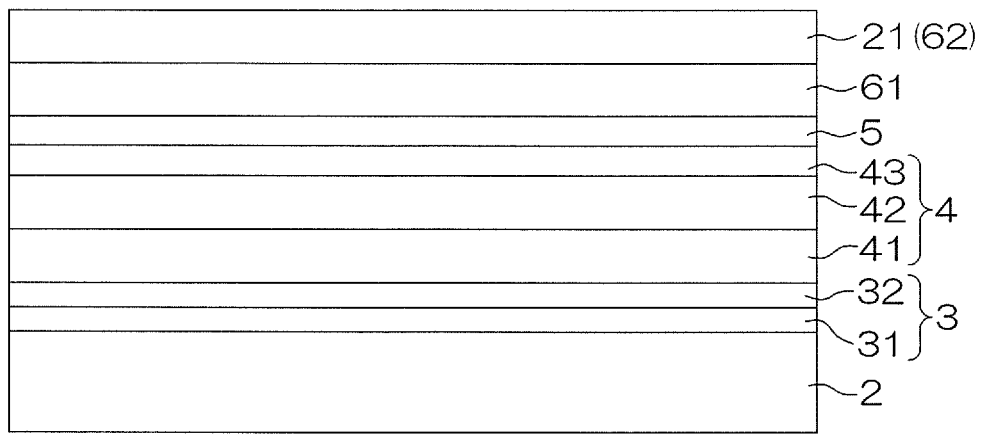
FIG. 2B is a sectional view showing a step next to the step in FIG. 2A.

Next, as shown in FIG. 2B, a gate electrode film 21 is formed on the nitride semiconductor layer 61. The gate electrode film 21 is formed from, for example, a metal film made of TiN.

Figure 2C:
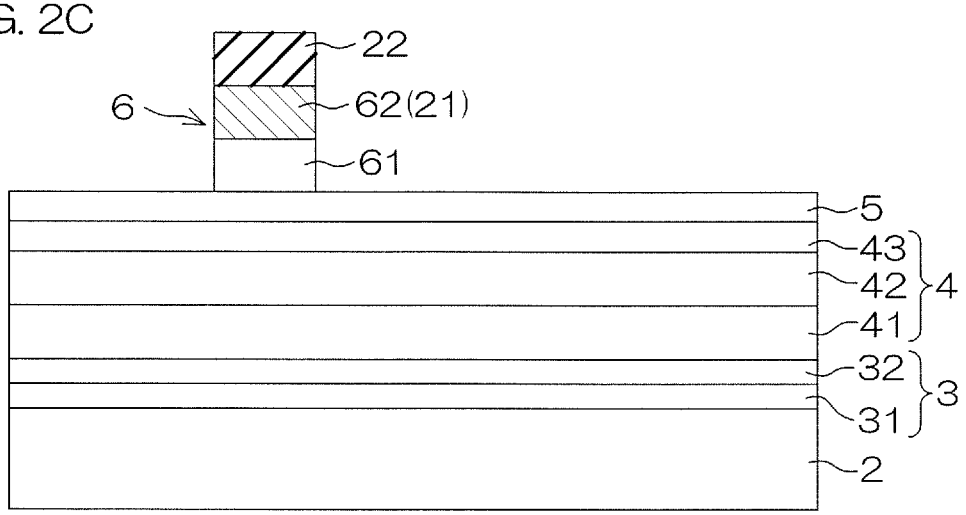
FIG. 2C is a sectional view showing a step next to the step in FIG. 2B.

Next, as shown in FIG. 2C, a resist film 22 is formed so as to cover a gate electrode formation region on the front surface of the gate electrode film 21. The gate electrode film 21 and the nitride semiconductor layer 61 are then selectively etched by using the resist film 22 as a mask.

With this process, the gate electrode film 21 is patterned to obtain the gate electrode 62. In addition, the nitride semiconductor layer 61 is patterned into the same pattern as that of the gate electrode 62. In this manner, the gate portion 6 constituted by the nitride semiconductor layer 61 and the gate electrode 62 is formed on the electron supply layer 5.

Figure 2D:
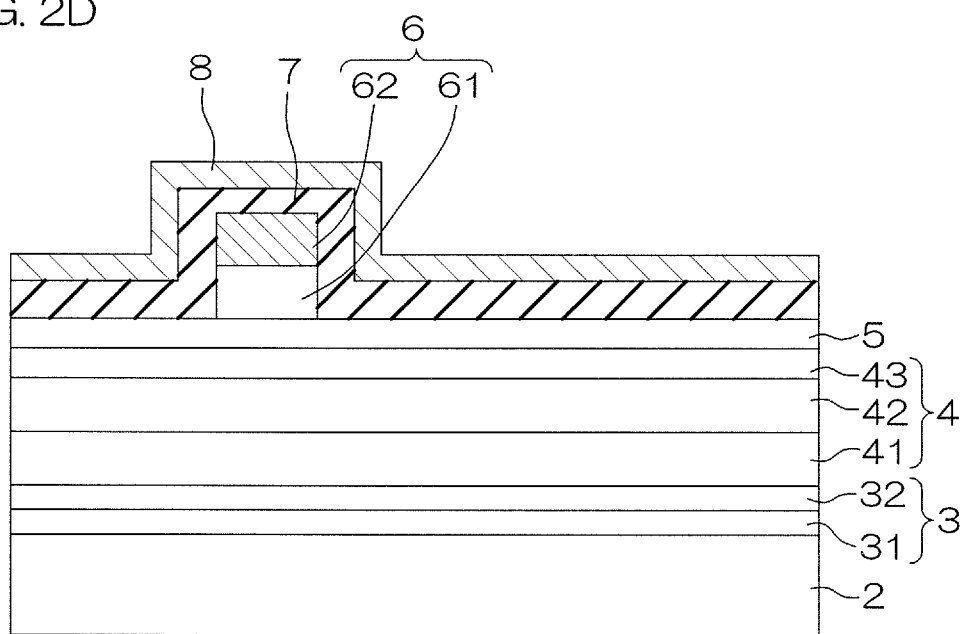
FIG. 2D is a sectional view showing a step next to the step in FIG. 2C.

Next, the resist film 22 is removed. Thereafter, as shown in FIG. 2D, the passivation film 7 is formed so as to cover the entire exposed front surface. The barrier metal film 8 is formed on the front surface of the passivation film 7. The passivation film 7 is formed from, for example, a SiN layer. The barrier metal film 8 is formed from, for example, a TiN layer.

Figure 2E:
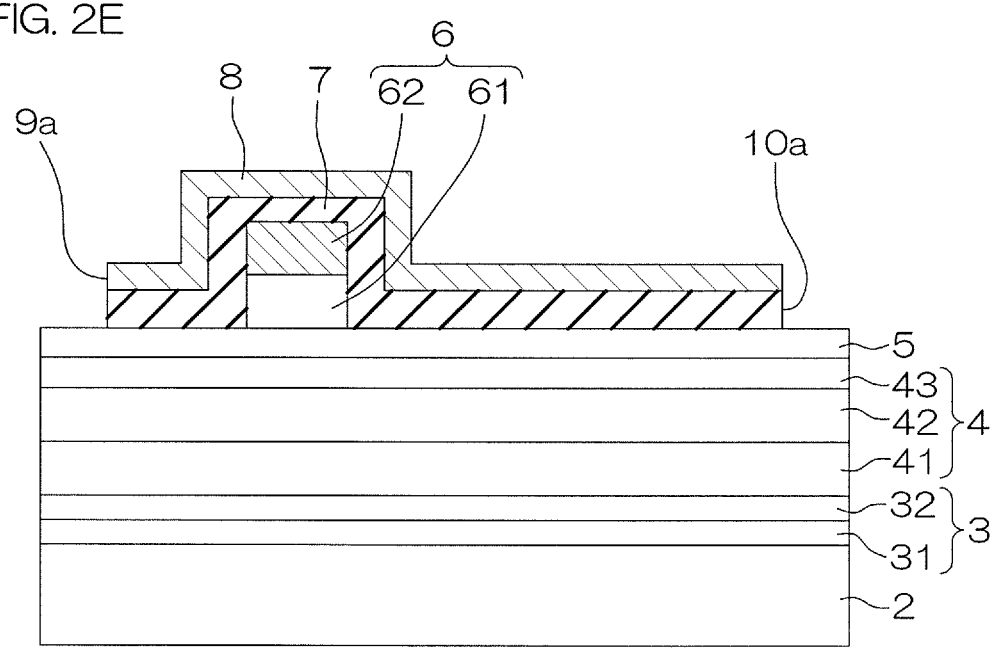
FIG. 2E is a sectional view showing a step next to the step in FIG. 2D.

Next, as shown in FIG. 2E, the source electrode contact hole 9a and the drain electrode contact hole 10a are formed in the passivation film 7 and the barrier metal film 8.

Figure 2F:
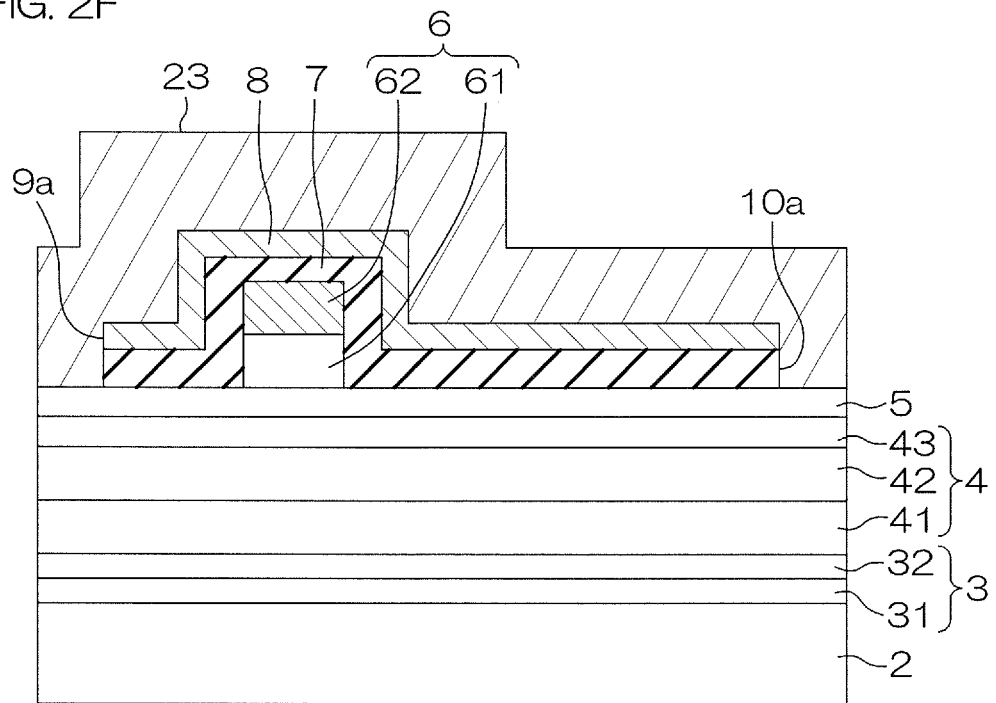
FIG. 2F is a sectional view showing a step next to the step in FIG. 2E.

Next, as shown in FIG. 2F, a source-drain electrode film 23 is formed so as to cover the entire exposed front surface. The source-drain electrode film 23 is formed from a laminated metal film formed by laminating a Ti layer as a lower layer, an Al layer as an intermediate layer, and a TiN layer as an upper layer on each other, and is formed by sequentially vapor-depositing the respective layers.

Figure 2G:
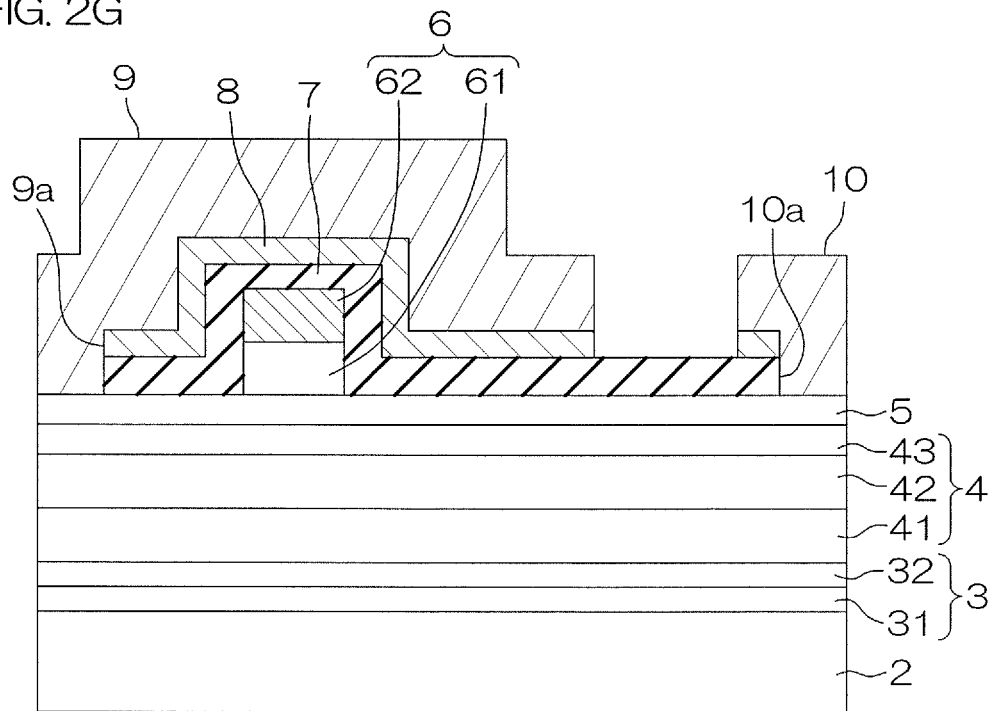
FIG. 2G is a sectional view showing a step next to the step in FIG. 2F.

Next, as shown in FIG. 2G, the source-drain electrode film 23 and the barrier metal film 8 are then patterned by etching and further annealed to form the source electrode 9 and the drain electrode 10, which make ohmic contact with the electron supply layer 5. With this process, the semiconductor device 1 having the structure shown in FIG. 1 is obtained.

[1] Example 1

In Example 1, the acceptor-type impurity contained in a first nitride semiconductor layer 41 is magnesium (Mg). A difference ($N_T$–$N_D$) between an acceptor density $N_T$ and a donor density $N_D$ of the first nitride semiconductor layer 41 is $5 \times 10^{17}$ cm$^{-3}$. A difference ($E_T$–$E_V$) between an acceptor level $E_T$ and a valence band upper end energy $E_V$ of the first nitride semiconductor layer 41 is 0.2 eV.

In contrast to this, the acceptor-type impurity contained in a second nitride semiconductor layer 42 is carbon (C). The difference ($N_T$–$N_D$) between the acceptor density $N_T$ and the donor density $N_D$ of the second nitride semiconductor layer 42 is $4 \times 10^{16}$ cm$^{-3}$. The difference ($E_T$–$E_V$) between the acceptor level $E_T$ and the valence band upper end energy $E_V$ of the second nitride semiconductor layer 42 is 0.9 eV.

That is, the difference ($N_T$–$N_D$) between the acceptor density $N_T$ and the donor density $N_D$ of the first nitride semiconductor layer 41 is larger than that of the second nitride semiconductor layer 42, and the difference ($E_T$–$E_V$) between the acceptor level $E_T$ and the valence band upper end energy $E_V$ of the first nitride semiconductor layer 41 is smaller than that of the second nitride semiconductor layer 42.

[2] Example 2

In Example 2, the acceptor-type impurity contained in a first nitride semiconductor layer 41 is zinc (Zn). A difference ($N_T$–$N_D$) between an acceptor density $N_T$ and a donor density $N_D$ of the first nitride semiconductor layer 41 is $5 \times 10^{17}$ cm$^{-3}$. A difference ($E_T$–$E_V$) between an acceptor level $E_T$ and a valence band upper end energy $E_V$ of the first nitride semiconductor layer 41 is 0.3 eV.

In contrast to this, the acceptor-type impurity contained in a second nitride semiconductor layer 42 is carbon (C). The difference ($N_T$–$N_D$) between the acceptor density $N_T$ and the donor density $N_D$ of the second nitride semiconductor layer 42 is $4 \times 10^{16}$ cm$^{-3}$. The difference ($E_T$–$E_V$) between the acceptor level $E_T$ and the valence band upper end energy $E_V$ of the second nitride semiconductor layer 42 is 0.9 eV.

[3] Example 3

In Example 3, the acceptor-type impurity contained in a first nitride semiconductor layer 41 is magnesium (Mg). A difference ($N_T$–$N_D$) between an acceptor density $N_T$ and a donor density $N_D$ of the first nitride semiconductor layer 41 is $5 \times 10^{17}$ cm$^{-3}$. A difference ($E_T$–$E_V$) between an acceptor level $E_T$ and a valence band upper end energy $E_V$ of the first nitride semiconductor layer 41 is 0.2 eV.

In contrast to this, the acceptor-type impurity contained in a second nitride semiconductor layer 42 is iron (Fe). The difference ($N_T$–$N_D$) between the acceptor density $N_T$ and the donor density $N_D$ of the second nitride semiconductor layer 42 is $4 \times 10^{16}$ cm$^{-3}$. The difference ($E_T$–$E_V$) between the acceptor level $E_T$ and the valence band upper end energy $E_V$ of the second nitride semiconductor layer 42 is 2.8 eV.

[4] Example 4

In Example 4, the acceptor-type impurity contained in a first nitride semiconductor layer 41 is zinc (Zn). A difference ($N_T$–$N_D$) between an acceptor density $N_T$ and a donor density $N_D$ of the first nitride semiconductor layer 41 is $5 \times 10^{17}$ cm$^{-3}$. A difference ($E_T$–$E_V$) between an acceptor level $E_T$ and a valence band upper end energy $E_V$ of the first nitride semiconductor layer 41 is 0.3 eV.

In contrast to this, the acceptor-type impurity contained in a second nitride semiconductor layer 42 is iron (Fe). The difference ($N_T$–$N_D$) between the acceptor density $N_T$ and the donor density $N_D$ of the second nitride semiconductor layer 42 is $4 \times 10^{16}$ cm$^{-3}$. The difference ($E_T$–$E_V$) between the acceptor level $E_T$ and the valence band upper end energy $E_V$ of the second nitride semiconductor layer 42 is 2.8 eV.

According to Examples 1 to 4, it is possible to increase the recovery amount of drain current reduced by current collapse and also shorten the recovery time for drain current reduced by current collapse. This reason will be described in detail later.

The following will explain the reason why, when the difference ($N_T$–$N_D$) between the acceptor density $N_T$ and the donor density $N_D$ of the first nitride semiconductor layer 41 is larger than that of the second nitride semiconductor layer 42, it is possible to increase the recovery amount of drain current reduced by current collapse. The following will also explain the reason why, when the difference ($E_T$–$E_V$) between the acceptor level $E_T$ and the valence band upper end energy $E_V$ of the first nitride semiconductor layer 41 is smaller than that of the second nitride semiconductor layer 42, it is possible to shorten the recovery time for drain current reduced by current collapse.

A cause of generation of current collapse will be described by exemplifying the semiconductor device 1 in FIG. 1.

The electron transit layer 4 made of GaN contains an unintentional donor. When the electron transit layer 4 becomes an n-type layer, a leak current flows between the source electrode 9 and the drain electrode 10. Accordingly, in order to inhibit the electron transit layer 4 from becoming an n-type layer, the electron transit layer 4 (in particular, the high impurity concentration layer A) is doped with an acceptor-type impurity (deep acceptor) for providing positive holes. The electrons emitted from the donor are trapped by the deep acceptor. However, since the acceptor density (trap density) $N_T$ is higher than the donor density $N_D$, a deep acceptor (vacant acceptor) that has trapped no electron is present in the electron transit layer 4. That is, the electron transit layer 4 (in particular, the high impurity concentration layer A) has a semi-insulating property. A deep acceptor that has trapped electrons is negatively charged.

When the semiconductor device 1 is OFF, a positive voltage is applied to the drain of the semiconductor device 1. When the semiconductor device 1 is ON, a lower voltage is applied to the drain of the semiconductor device 1. When a positive voltage is applied to the drain of the semiconductor device 1, positive holes are emitted from the deep acceptor in which electrons are not trapped to the valence band on the drain electrode 10 side of the electron transit layer 4. That is, positive hole emission occurs. In other words, the deep acceptor that has trapped no electrons traps electrons from the valence band. This will also negatively charge even the deep acceptor that has trapped no electron, thereby enlarging the negative electric charge region (negatively charged region) in the electron transit layer 4. Since the two-dimensional electron gas formed in the electron transit layer 4 repels a negatively charged region, the expansion of the negatively charged region in the electron transit layer 4 will reduce the two-dimensional electron gas. This increases the channel resistance and hence reduces the drain current. This phenomenon is called current collapse.

The time constant for positive hole emission decreases with a decrease in the difference ($E_T$–$E_V$) between the acceptor level $E_T$ and the valence band upper end energy level $E_V$ in the electron transit layer 4. The time constant for positive hole emission is the time from the application of a positive voltage to the electron transit layer 4 to the occurrence of positive hole emission. When, for example, the acceptor is carbon (C), the energy difference ($E_T$–$E_V$) is 0.9 eV, and the time constant for positive hole emission is about 100 sec.

Next, a half-recovery phenomenon of current collapse will be described.

An experiment for checking a half-recovery phenomenon of current collapse was conducted by using a semiconductor device 101 shown in FIG. 3.

The semiconductor device 101 includes a substrate 102, a buffer layer 103 formed on the front surface of the substrate 102, an electron transit layer 104 formed from a nitride semiconductor layer epitaxially grown on the buffer layer 103, and an electron supply layer 105 formed from a nitride semiconductor layer epitaxially grown on the electron transit layer 104. The semiconductor device 101 further includes a source electrode 109, a drain electrode 110, and an insulating layer 111, which are formed on the electron supply layer 105. The insulating layer 111 is formed on a region, on the electron supply layer 105, on which the source electrode 109 and the drain electrode 110 are not formed. A substrate electrode 112 is formed on the rear surface of the substrate 102.

Like the substrate 2 in FIG. 1, the substrate 102 is formed from an Si substrate. Like the buffer layer 3 in FIG. 1, the buffer layer 103 is constituted by a first buffer layer 131 formed from an AlN film in contact with the front surface of the substrate 102 and a second buffer layer 132 formed from an AlGaN film laminated on the front surface of the first buffer layer 131 (the front surface on the opposite side to the substrate 102).

The electron transit layer 104 is constituted by a first nitride semiconductor layer 141 epitaxially grown on the buffer layer 103 and a second nitride semiconductor layer 142 epitaxially grown on the first nitride semiconductor layer 141. The first nitride semiconductor layer 141 corresponds to the high impurity concentration layer A (the first nitride semiconductor layer 41 and the second nitride semiconductor layer 42) in FIG. 1. The second nitride semiconductor layer 142 corresponds to the low impurity concentration layer B (the third nitride semiconductor layer 43) in FIG. 1.

The first nitride semiconductor layer 141 is formed from a GaN layer doped with an acceptor-type impurity, and has a thickness of about 0.9 μm. The acceptor-type impurity has a concentration of, for example, about $1 \times 10^{18}$ cm$^{-3}$. The acceptor-type impurity is carbon (C). The second nitride semiconductor layer 142 is formed from a GaN layer doped with an acceptor-type impurity, and has a thickness of about 0.1 μm. The acceptor-type impurity is carbon (C). The acceptor-type impurity in the second nitride semiconductor layer 142 has a concentration of, for example, about $1 \times 10^{16}$ cm$^{-3}$.

The electron supply layer 105 corresponds to the electron supply layer 5 in FIG. 1. The electron supply layer 105 is made of AlGaN, and has a thickness of about 10 nm. The insulating layer 111 is made of SiN.

According to the semiconductor device 1 in FIG. 1, when the semiconductor device 1 is OFF, a positive voltage of about 200 V to 300 V is applied to the drain of the semiconductor device 1. In this experiment, when the source electrode 109 is set to a reference potential (0 V), a voltage of 1 V and a voltage of −20 V are respectively applied to the drain electrode 110 and the substrate electrode 112. This sets a state equivalent to a state in which a positive high voltage is applied to the drain of the semiconductor device 101.

Specifically, when the source electrode 109 was set to the reference potential (0 V) and a voltage of 1 V was applied to the drain electrode 110, a voltage of 0 V was applied to the substrate electrode 112 for 100 sec. Thereafter, a voltage of −20 V was applied to the substrate electrode 112 for 2,000 sec. A voltage of 0 V was then applied to the substrate electrode 112 for 2,000 sec. A current (drain current) Id flowing in the drain electrode 110 during this period was measured.

Figure 4:
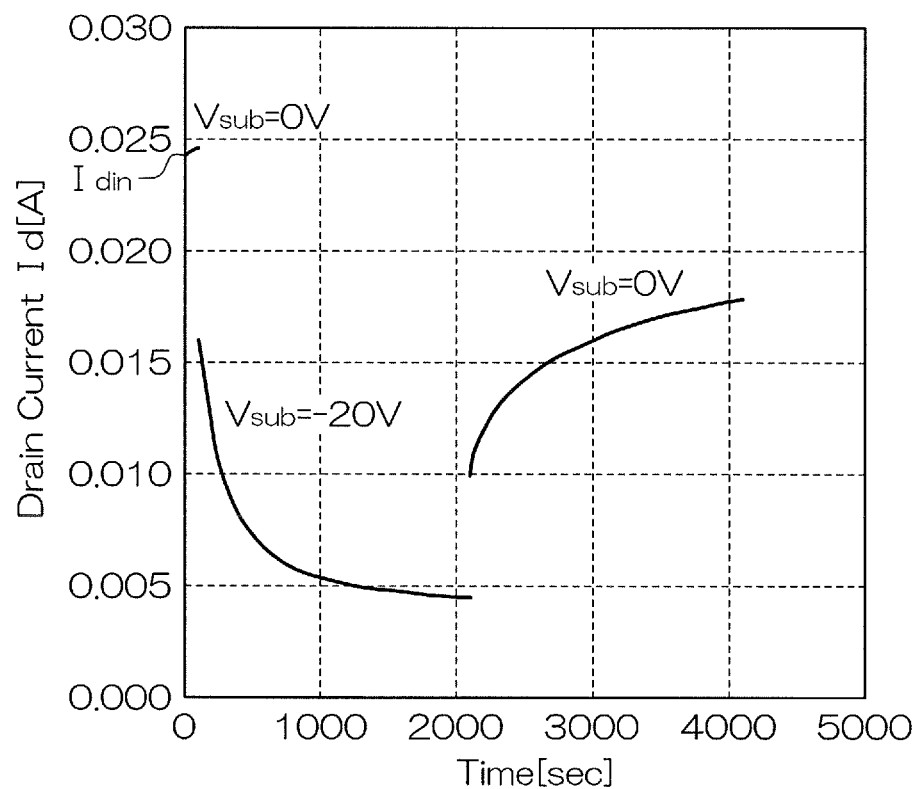
FIG. 4 is a graph showing experimental results.

FIG. 4 is a graph showing experimental results.

At the start of an experiment, an applied voltage Vsub to the substrate electrode 112 is 0 V, and a drain current Id (initial value Idin) at this time is about 0.024 [A]. When a voltage of −20 V is applied to the substrate electrode 112 after the elapse of 100 sec, the drain current Id rapidly decreases first and then gradually decreases. In this case, the drain current Id decreases to about 0.004 [A]. When the applied voltage Vsub to the substrate electrode 112 returns to 0 V after the elapse of 2,000 sec, the drain current Id rapidly decreases to about 0.010 [A] and then gradually increases. After the elapse of 2,000 sec, the drain current Id becomes about 0.018 [A]. That is, it is understood that the drain current Id recovers from about 0.004 [A], which is the minimum value, to about 0.018 [A], however, the drain current Id does not recover to about 0.024 [A], which is the initial value.

In order to set a long time during which a voltage of −20 V is applied to the substrate electrode 112 and a long time during which the applied voltage to the substrate electrode 112 is kept returned to 0 V, changes in drain current were measured by simulations.

Figure 5:
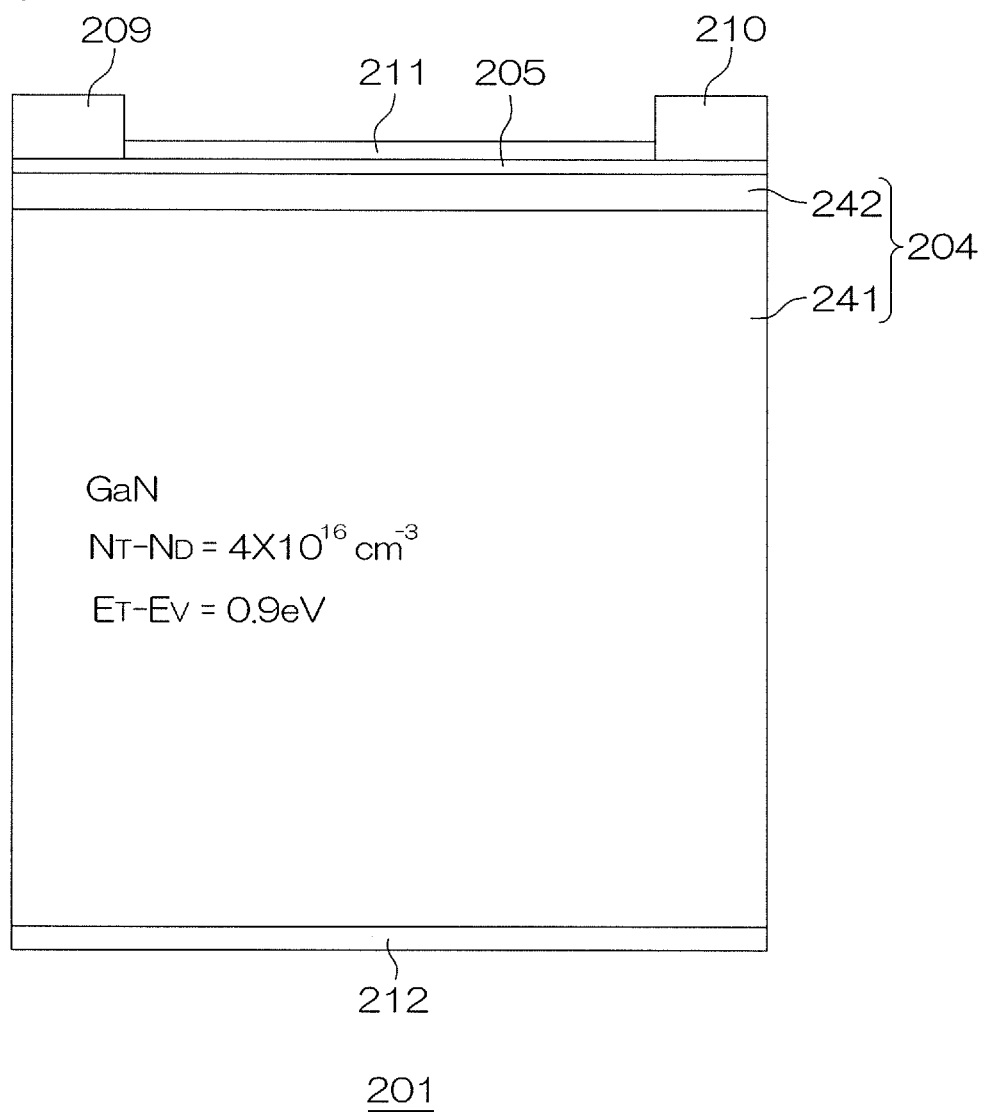
FIG. 5 is a schematic view showing the arrangement of a semiconductor device as a first simulation target.

FIG. 5 is a schematic view showing the arrangement of a semiconductor device 201 as a first simulation target.

The semiconductor device 201 as the first simulation target has the same arrangement as that of the semiconductor device 101 in FIG. 3 except that the semiconductor device 201 has no substrate. The semiconductor device 201 as the first simulation target includes an electron transit layer 204, an electron supply layer 205 formed on the electron transit layer 204, a source electrode 209 formed on the electron supply layer 205, a drain electrode 210 formed on the electron supply layer 205, an insulating layer 211 formed on the electron supply layer 205, and a substrate electrode 212 formed on the rear surface of the electron transit layer 204.

The electron transit layer 204 corresponds to the electron transit layer 104 in FIG. 3. The electron transit layer 204 is constituted by a first nitride semiconductor layer 241 and a second nitride semiconductor layer 242 formed on the first nitride semiconductor layer 241. The first nitride semiconductor layer 241 corresponds to the first nitride semiconductor layer 141 (the high impurity concentration layer A in FIG. 1) in FIG. 3. The second nitride semiconductor layer 242 corresponds to the second nitride semiconductor layer 142 (the low impurity concentration layer B in FIG. 1) in FIG. 3.

A difference ($N_T$–$N_D$) between an acceptor density $N_T$ and a donor density $N_D$ of the first nitride semiconductor layer 241 is set to $4 \times 10^{16}$ cm$^{-3}$. A difference ($E_T$–$E_V$) between an acceptor level $E_T$ and a valence band upper end energy level $E_V$ of the first nitride semiconductor layer 241 is set to 0.9 eV.

In this simulation, the source electrode 209 was set to a reference potential (0 V), and the applied voltage to the drain electrode 110 was set to 1 V. A voltage of −20 V was applied to the substrate electrode 212 for 10,000 sec. Thereafter, a voltage of 0 V was applied to the substrate electrode 212 for 10,000 sec. A current (drain current) Id flowing in the drain electrode at this time was calculated.

Figure 6:
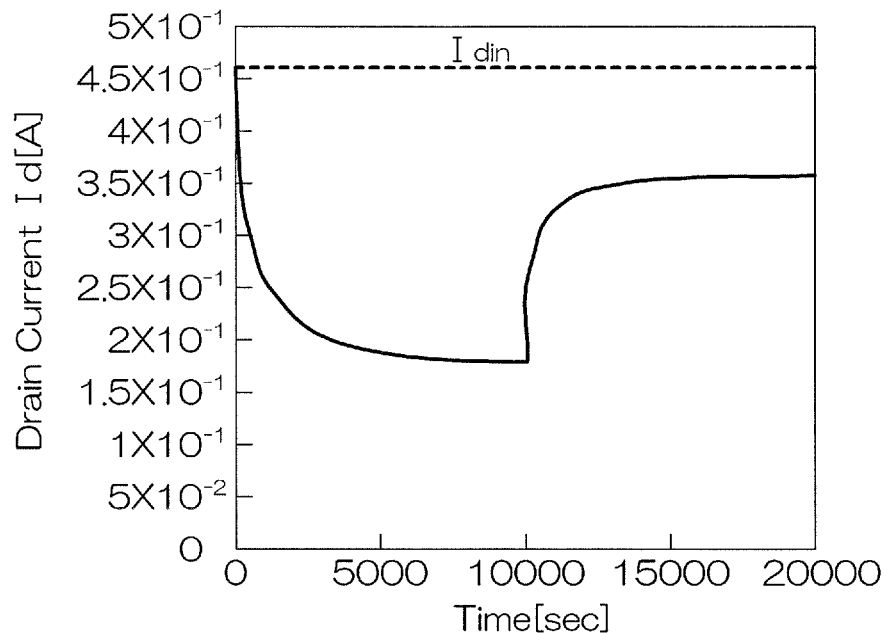
FIG. 6 is a graph showing simulation results.

FIG. 6 is a graph showing simulation results.

FIG. 6 indicates that after a voltage of −20 V is applied to the substrate electrode 212 for 10,000 sec and the applied voltage to the substrate electrode 212 then returns to 0 V, the drain current Id does not recover to the initial value (Idin) even after the elapse of 10,000 sec. Such a phenomenon is called a half-recovery phenomenon. In addition, it was found that the drain current was reduced with a time constant for positive hole emission corresponding to the difference ($E_T$–$E_V$) between the acceptor energy level $E_T$ and the valence band upper end energy level $E_V$ in the first nitride semiconductor layer 241, and the drain current was half-recovered with the time constant for positive hole emission corresponding to the difference ($E_T$–$E_V$).

The mechanism of a half-recovery phenomenon will be described below with reference to FIGS. 5, 6, 7, and 8.

Figure 7:
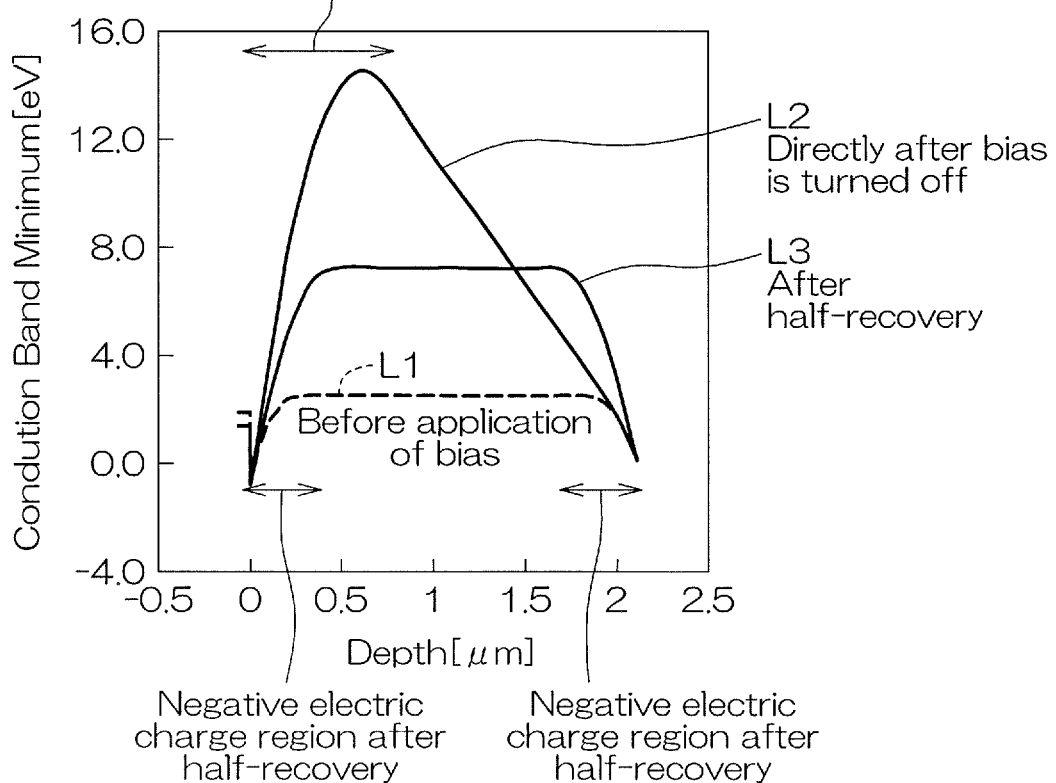
FIG. 7 is a graph showing the distribution of conductive band lower end energy $E_c$ with respect to the depth of an electron transit layer.

FIG. 7 is a graph showing the distribution of conductive band lower end energy $E_c$ [eV] with respect to the depth [µm] of the electron transit layer 204 (see FIG. 5). The depth of the electron transit layer 204 is expressed by the distance from the front surface of the electron transit layer 204 which is located on the electron supply layer 205 side.

A curve L1 in FIG. 7 indicates the distribution of the conductive band lower end energy $E_c$ with respect to the depth of the electron transit layer 204 before a bias of –20 V is applied to the substrate electrode 212. A curve L2 in FIG. 7 indicates the distribution of the conductive band lower end energy $E_c$ with respect to the depth of the electron transit layer 204 directly after a bias of –20 V is applied to the substrate electrode 212. A curve L3 in FIG. 7 indicates the distribution of the conductive band lower end energy $E_c$ with respect to the depth of the electron transit layer 204 after half-recovery.

FIG. 8 is graphs each indicating negative electric charge density with respect to the depth of the electron transit layer 204. The upper graph in FIG. 8 indicates negative electric charge density with respect to the depth of the electron transit layer 204 directly after a bias of –20 V to the substrate electrode 212 is turned off. The lower graph in FIG. 8 indicates negative electric charge density with respect to the depth of the electron transit layer 204 after half-recovery. Referring to FIG. 8, q represents an elementary charge density.

When the applied voltage to the substrate electrode 212 is –20 V, a positive bias is applied to the 2DEG side (electron supply layer 205 side) of the electron transit layer 204. Accordingly, positive hole emission occurs on the 2DEG side of the electron transit layer 204. This forms a negative electric charge region on the 2DEG side of the electron transit layer 204. This then reduces the drain current.

Subsequently, directly after the applied voltage to the substrate electrode 212 is returned to 0 V (the bias to the substrate electrode 212 is turned off), the conductive band lower end energy $E_c$ with respect to the depth of the electron transit layer 204 changes as indicated by the curve L2 in FIG. 7, and the negative electric charge density with respect to the depth of the electron transit layer 204 changes as indicated by the upper graph in FIG. 8.

That is, directly after a bias to the substrate electrode 212 is turned off, a negative electric charge region is formed on the 2DEG side in the electron transit layer 204, as indicated by the upper graph in FIG. 8. Directly after the bias to the substrate electrode 212 is turned off, the conductive band lower end energy $E_c$ near the lower end of the negative electric charge region on the 2DEG side rises, as indicated by the curve L2 in FIG. 7. When the depth position where the conductive band lower end energy $E_c$ rises is regarded as a reference point, this state is equivalent to a state in which a positive bias is applied to the substrate electrode 212 side (to be referred as the substrate side hereinafter) of the electron transit layer 204. This causes positive hole emission on the substrate side of the electron transit layer 204. This will form a negative electric charge region on the substrate side of the electron transit layer 204, as indicated by the lower graph in FIG. 8.

The positive holes emitted from the substrate side of the electron transit layer 204 move toward the depth position where the conductive band lower end energy $E_c$ has risen. That is, the positive holes emitted from the substrate side of the electron transit layer 204 move toward the 2DEG side of the electron transit layer 204. The positive holes then cancel the negative electric charge in the negative electric charge region formed on the 2DEG side of the electron transit layer 204. This reduces the negative electric charge region on the 2DEG side of the electron transit layer 204, as indicated by the lower graph in FIG. 8. In this manner, a half-recovery phenomenon occurs.

As shown in FIG. 8, the half-recovery phenomenon divides the negative electric charge region formed on the 2DEG side of the electron transit layer 204 into two regions on the 2DEG side and the substrate side. Note that half-recovery phenomenon will not change the total amount of negative charge of the electron transit layer 204.

Figure 9:
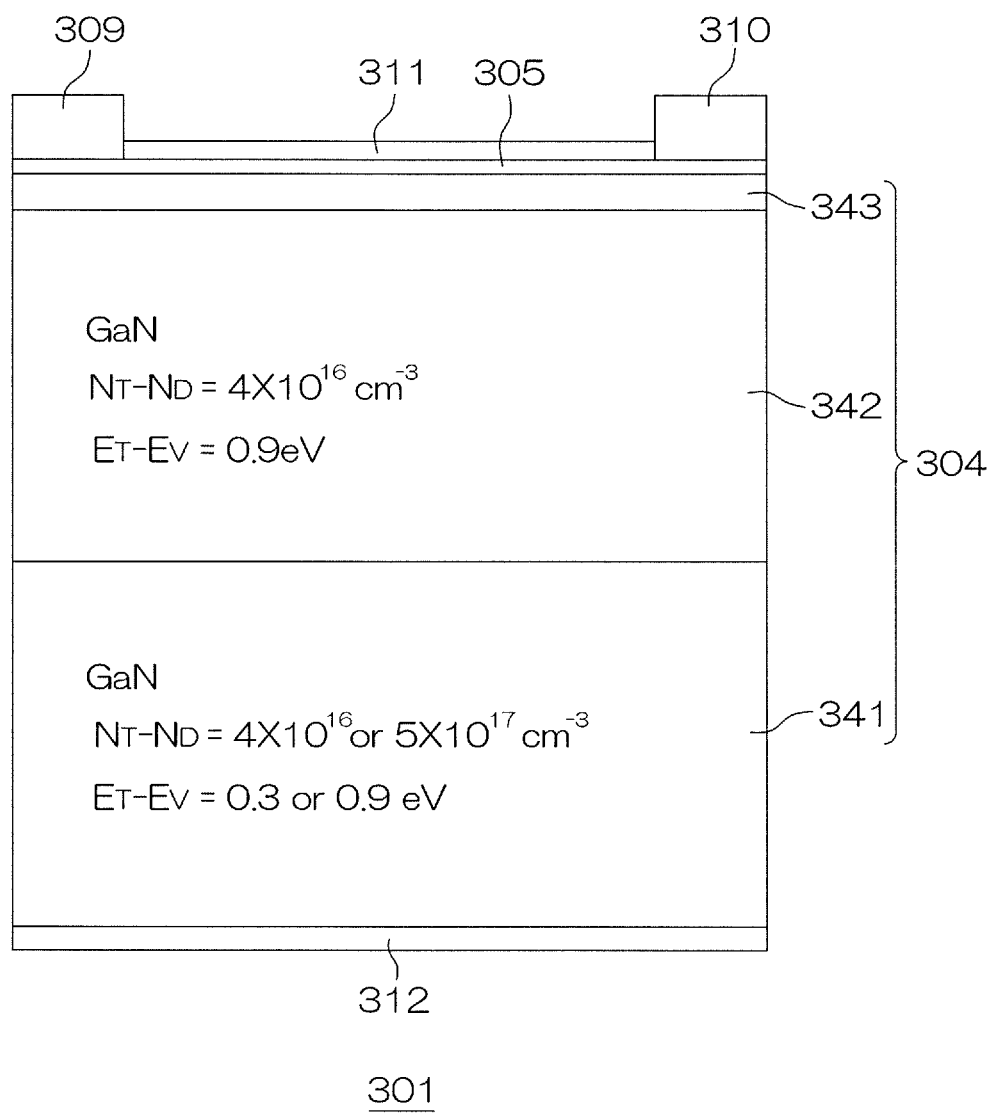
FIG. 9 is a schematic view showing the arrangement of a semiconductor device as a second simulation target.

FIG. 9 is a schematic view showing the arrangement of a semiconductor device 301 as a second simulation target.

The semiconductor device 301 as the second simulation target has the same arrangement as that of the semiconductor device 1 in FIG. 1 except that the semiconductor device 301 has neither the substrate nor the gate portion. The semiconductor device 301 as the second simulation target includes an electron transit layer 304, an electron supply layer 305 formed on the electron transit layer 304, a source electrode 309 formed on the electron supply layer 305, a drain electrode 310 formed on the electron supply layer 305, an insulating layer 311 formed on the electron supply layer 305, and a substrate electrode 312 formed on the rear surface of the electron transit layer 304.

The electron transit layer 304 corresponds to the electron transit layer 4 in FIG. 1. The electron transit layer 304 is constituted by a first nitride semiconductor layer 341, a second nitride semiconductor layer 342 formed on the first nitride semiconductor layer 341, and a third nitride semiconductor layer 343 formed on the second nitride semiconductor layer 342. The first nitride semiconductor layer 341 corresponds to the first nitride semiconductor layer 41 in FIG. 1. The second nitride semiconductor layer 342 corresponds to the second nitride semiconductor layer 42 in FIG. 1. The third nitride semiconductor layer 343 corresponds to the third nitride semiconductor layer 43 in FIG. 1.

That is, the semiconductor layer constituted by the first nitride semiconductor layer 341 and the second nitride semiconductor layer 342 corresponds to the high impurity concentration layer A in FIG. 1. The third nitride semiconductor layer 343 corresponds to the low impurity concentration layer B in FIG. 1.

A difference ($N_T$–$N_D$) between an acceptor density $N_T$ and a donor density $N_D$ and a difference ($E_T$–$E_V$) between an acceptor level $E_T$ and a valence band upper end energy level $E_V$ of the second nitride semiconductor layer 342 are respectively set to the same values as those of ($N_T$–$N_D$) and ($E_T$–$E_V$) of the first nitride semiconductor layer 141 of the semiconductor device 201 as the first simulation target.

That is, the difference ($N_T$–$N_D$) between the acceptor density $N_T$ and the donor density $N_D$ of the second nitride semiconductor layer 342 is set to $4\times10^{16}$ cm$^{-3}$. The difference ($E_T$–$E_V$) between the acceptor level $E_T$ and the valence band upper end energy level $E_V$ of the third nitride semiconductor layer 343 is set to 0.9 eV.

The difference ($N_T$–$N_D$) between the acceptor density $N_T$ and the donor density $N_D$ of the first nitride semiconductor layer 341 can be set to $4 \times 10^{16}$ cm$^{-3}$ or $5 \times 10^{17}$ cm$^{-3}$. The difference ($E_T$–$E_V$) between the acceptor level $E_T$ and the valence band upper end energy level $E_V$ of the first nitride semiconductor layer 341 can be set to 0.3 eV or 0.9 eV.

That is, there are four combinations of ($N_T$–$N_D$) and ($E_T$–$E_V$) of the first nitride semiconductor layer 341 as follows:

First combination: ($N_T$–$N_D$)=$4 \times 10^{16}$ cm$^{-3}$ and ($E_T$–$E_V$)=0.9 eV Second combination: ($N_T$–$N_D$)=$4 \times 10^{16}$ cm$^{-3}$ and ($E_T$–$E_V$)=0.3 eV Third combination: ($N_T$–$N_D$)=$5 \times 10^{17}$ cm$^{-3}$ and ($E_T$–$E_V$)=0.9 eV Fourth combination: ($N_T$–$N_D$)=$5 \times 10^{17}$ cm$^{-3}$ and ($E_T$–$E_V$)=0.3 eV The following simulation was performed for each combination of ($N_T$–$N_D$) and ($E_T$–$E_V$) of the first nitride semiconductor layer 341. That is, the source electrode 309 was set to the reference potential (0 V), and the applied voltage to the drain electrode 310 was set to 1 V. After a voltage of −20 V was applied to the substrate electrode 312 for 10,000 sec, a voltage of 0 V was applied to the substrate electrode 312 for 10,000 sec. At this time, a current (drain current) Id flowing in the drain electrode was calculated.

Figure 10:
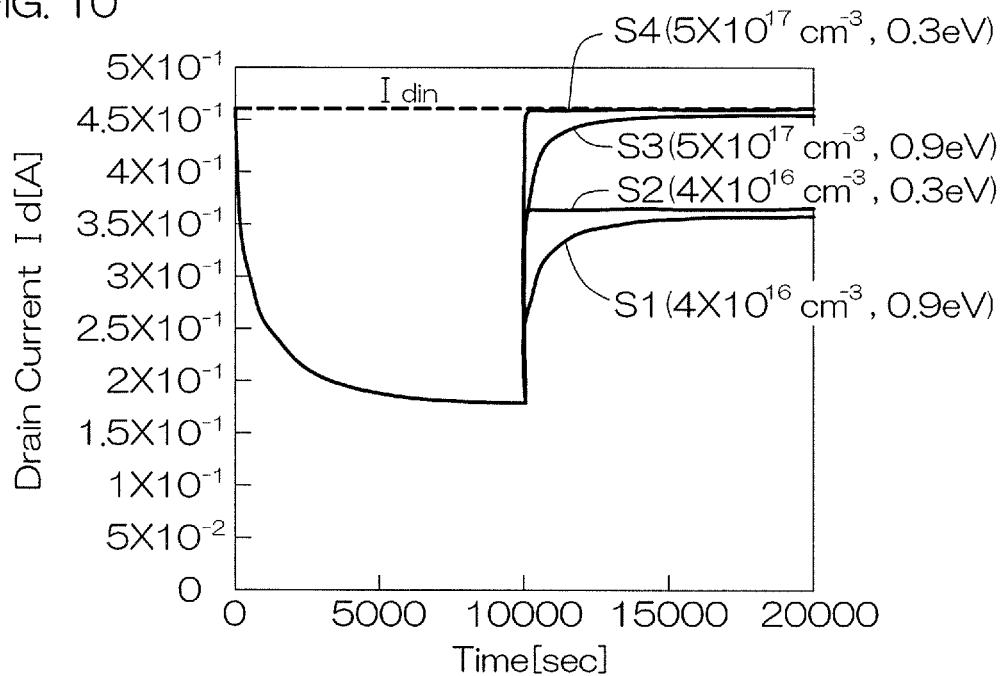
FIG. 10 is a graph showing simulation results.

FIG. 10 is a graph showing simulation results.

Referring to FIG. 10, graph curves S1, S2, S3, and S4 respectively show changes in the drain current Id when the combinations of ($N_T$–$N_D$) and ($E_T$–$E_V$) of the first nitride semiconductor layer 341 are the first combination, the second combination, the third combination, and the fourth combination.

A change in the drain current Id when a voltage of −20 V was applied to the substrate electrode 312 for 10,000 sec was similar to that in the case of each of the combinations of ($N_T$–$N_D$) and ($E_T$–$E_V$) of the first nitride semiconductor layer 341. This is because, when a voltage of −20 V is applied to the substrate electrode 312, the drain current Id is reduced with a time constant for positive hole emission corresponding to ($E_T$–$E_V$) of the second nitride semiconductor layer 342, of the first and second nitride semiconductor layers 341 and 342, which is located on the 2DEG side.

A change in the drain current Id after the applied voltage to the substrate electrode 312 is returned to 0 V (a change in the drain current Id after the bias is turned off) differs for each combination of ($N_T$–$N_D$) and ($E_T$–$E_V$) of the first nitride semiconductor layer 341. Specifically, when the combination of ($N_T$–$N_D$) and ($E_T$–$E_V$) of the first nitride semiconductor layer 341 is the first combination, the drain current Id after the bias is turned off gradually recovers, and the recovery amount is small. When the combination of ($N_T$–$N_D$) and ($E_T$–$E_V$) of the first nitride semiconductor layer 341 is the second combination, the drain current Id after the bias is turned off instantly recovers, however, the recovery amount is small.

When the combination of ($N_T$–$N_D$) and ($E_T$–$E_V$) of the first nitride semiconductor layer 341 is the third combination, the drain current Id after the bias is turned off gradually recovers, however, the recovery amount is large. When the combination of ($N_T$–$N_D$) and ($E_T$–$E_V$) of the first nitride semiconductor layer 341 is the fourth combination, the drain current Id after the bias is turned off instantly recovers, and the recovery amount is large.

That is, when ($E_T$–$E_V$) of the first nitride semiconductor layer 341 on the substrate side is small (0.3 eV), the recovery time for the drain current Id after the bias is turned off becomes short. Directly after the bias is turned off, positive hole emission occurs in the first nitride semiconductor layer 341 on the substrate side. This causes the drain current Id to half-recover. The time constant for positive hole emission in the first nitride semiconductor layer 341 on the substrate side decreases with a decrease in ($E_T$–$E_V$) of the first nitride semiconductor layer 341 on the substrate side. Accordingly, when ($E_T$–$E_V$) of the first nitride semiconductor layer 341 on the substrate side is small (0.3 eV), the recovery time for the drain current Id after the bias is turned off is short.

When ($N_T$–$N_D$) of the first nitride semiconductor layer 341 on the substrate side is large ($5 \times 10^{17}$ cm$^{-3}$), the recovery amount of the drain current Id is large. This is because, as ($N_T$–$N_D$) of the first nitride semiconductor layer 341 on the substrate side increases, the negative electric charge region can be moved more from the second nitride semiconductor layer 342 on the 2DEG side to the first nitride semiconductor layer 341 on the substrate side.

Figure 11:
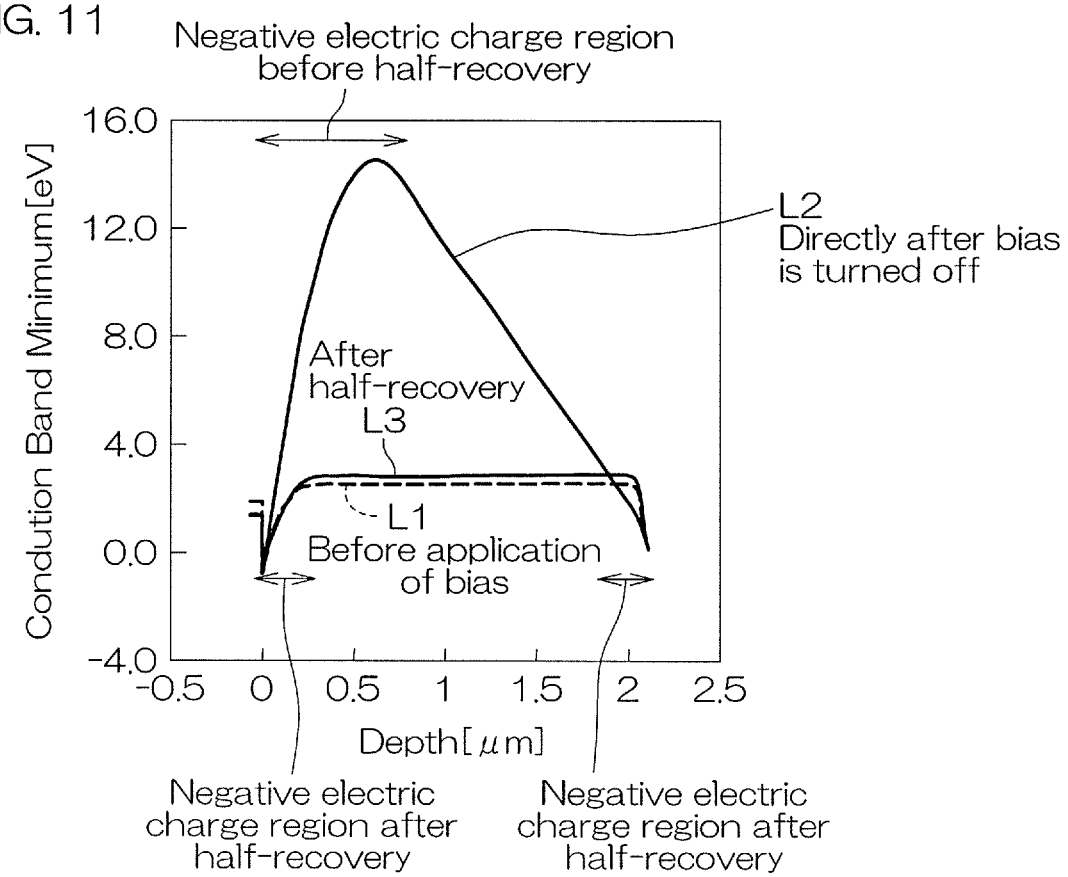
FIG. 11 is a graph showing the distribution of the conductive band lower end energy $E_c$ with respect to the depth of an electron transit layer when $(N_T-N_D)$ of a first nitride semiconductor layer on the substrate side is large.

FIG. 11 is a graph showing the distribution of the conductive band lower end energy $E_c$ [eV] with respect to the depth [μm] of the electron transit layer 304 when ($N_T$–$N_D$) of the first nitride semiconductor layer 341 on the substrate side is large. The depth of the electron transit layer 304 is expressed by the distance from the front surface of the electron transit layer 304 which is located on the electron supply layer 305 side.

A curve L1 in FIG. 11 indicates the distribution of the conductive band lower end energy $E_c$ with respect to the depth of the electron transit layer 304 before a bias of −20 V is applied to the substrate electrode 312. A curve L2 indicates the distribution of the conductive band lower end energy $E_c$ with respect to the depth of the electron transit layer 304 directly after the bias of −20 V to the substrate electrode 312 is turned off. A curve L3 indicates the distribution of the conductive band lower end energy $E_c$ with respect to the depth of the electron transit layer 304 after half-recovery.

FIG. 12 is graphs each showing negative electric charge density with respect to the depth of the electron transit layer 304 when ($N_T$–$N_D$) of the first nitride semiconductor layer 341 on the substrate side is large. The upper graph in FIG. 12 indicates negative electric charge density with respect to the depth of the electron transit layer 304 directly after a bias of −20 V to the substrate electrode 312 is turned off. The lower graph in FIG. 12 indicates negative electric charge density with respect to the depth of the electron transit layer 304 after half-recovery.

When ($N_T$–$N_D$) of the first nitride semiconductor layer 341 on the substrate side is larger than ($N_T$–$N_D$) of the second nitride semiconductor layer 342 on the 2DEG side, the amount of positive holes emitted on the substrate side in the electron transit layer 304 after the bias is turned off increases. Accordingly, as shown in FIG. 12, the negative electric charge region on the 2DEG side in the electron transit layer 304 tends to decrease, and a negative electric charge region tends to be formed on the substrate side in the electron transit layer 304. This increases the recovery amount of drain current.

Figure 13:
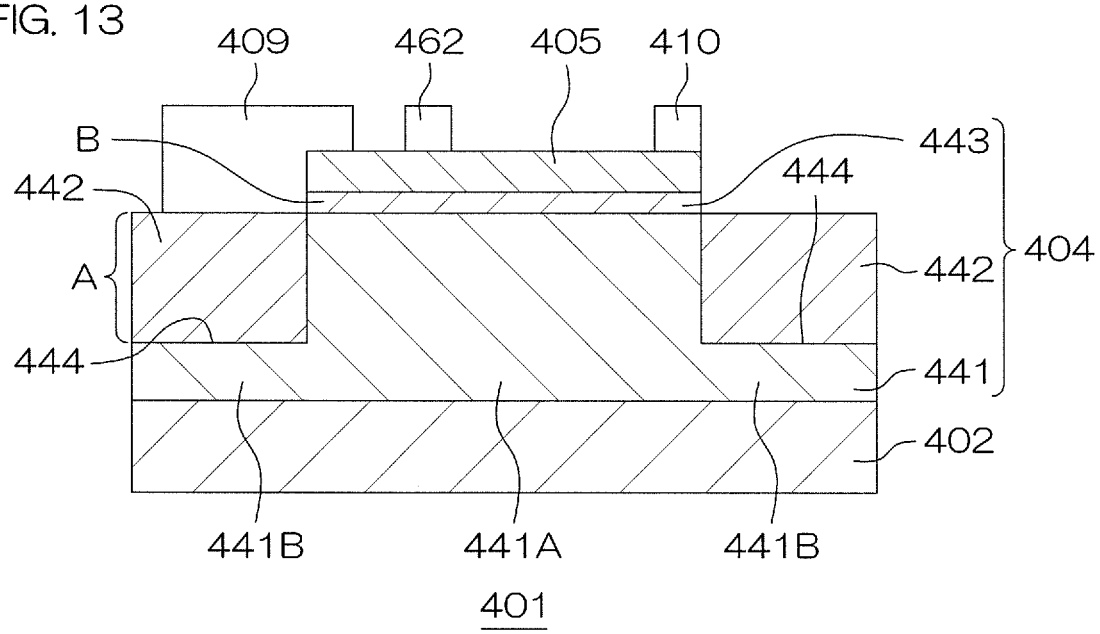
FIG. 13 is a sectional view showing another example of the arrangement of a semiconductor device.

FIG. 13 is sectional view showing another example of the arrangement of a semiconductor device.

A semiconductor device 401 includes a substrate 402, an electron transit layer 404 formed from a nitride semiconductor layer disposed on the substrate 402, an electron supply layer 405 formed from a nitride semiconductor layer formed on the electron transit layer 404, a source electrode 409 formed on the electron supply layer 405, a drain electrode 410, and a gate electrode 462.

The electron transit layer 404 includes a high impurity concentration layer A and a low impurity concentration layer B in which a two-dimensional electron gas is formed. The high impurity concentration layer A is a semiconductor layer containing a large amount of acceptor impurity. In contrast to this, the low impurity concentration layer B is a semiconductor layer containing almost no acceptor impurity.

The high impurity concentration layer A includes a first nitride semiconductor layer (second semiconductor region) 441 and a second nitride semiconductor layer (first semiconductor region) 442. The low impurity concentration layer B is formed from a third nitride semiconductor layer 443.

The first nitride semiconductor layer 441 has a convex shape in sectional view. Notched portions 444 are formed in both side portions of the first nitride semiconductor layer 441. With the notched portions 444, the first nitride semiconductor layer 441 is constituted by a thick portion 441A on a substantially central portion and thin portions 441B on both side portions. The second nitride semiconductor layers 442 are formed in the notched portions 444 of the first nitride semiconductor layer 441. The second nitride semiconductor layers 442 respectively formed in the notched portions 444 on both side portions of the first nitride semiconductor layer 441 are joined to each other in a region which is not shown.

The third nitride semiconductor layer 443 is formed on the thick portion 441A of the first nitride semiconductor layer 441. The electron supply layer 405 is formed on the third nitride semiconductor layer 443. The source electrode 409 is formed across the front surface of the electron supply layer 405 and the front surface of the second nitride semiconductor layer 442 on one side. The drain electrode 410 is formed at a position on the front surface of the electron supply layer 405 which is close to the second nitride semiconductor layer 442 on the other side. The gate electrode 462 is formed at a position on the front surface of the electron supply layer 405 which is located between the source electrode 409 and the drain electrode 410. The first nitride semiconductor layer 441, the second nitride semiconductor layer 442, and the third nitride semiconductor layer 443 each are formed from a GaN layer doped with an acceptor-type impurity.

The electron supply layer 405 is formed from a nitride semiconductor layer having a larger band gap than the electron transit layer 404. Specifically, the electron supply layer 405 is made of a nitride semiconductor having a higher Al composition than the electron transit layer 404. A nitride semiconductor having a higher Al composition has a larger band gap. In this preferred embodiment, the electron supply layer 405 is formed from an AlGaN layer.

In this preferred embodiment, the first nitride semiconductor layer 441 is disposed closer to the low impurity concentration layer B (conductive path forming layer) than the second nitride semiconductor layer 442. According to the preferred embodiment, therefore, in this preferred embodiment, the first nitride semiconductor layer 441 corresponds to the second semiconductor region according to the present invention, and the second nitride semiconductor layer 442 corresponds to the first semiconductor region according to the present invention.

Accordingly, in this preferred embodiment, the acceptor density $N_T$ of the second nitride semiconductor layer 442 is preferably larger than the acceptor density $N_T$ of the first nitride semiconductor layer 441. In other words, the difference $(N_T - N_D)$ between the acceptor density $N_T$ and the donor density $N_D$ of the second nitride semiconductor layer 442 is preferably larger than the difference $(N_T - N_D)$ between the acceptor density $N_T$ and the donor density $N_D$ of the first nitride semiconductor layer 441. This is because this can increase the recovery amount of drain current reduced by current collapse.

The difference $(E_T - E_V)$ between the acceptor level $E_T$ and the valence band upper end energy $E_V$ of the second nitride semiconductor layer 442 is preferably smaller than the difference $(E_T - E_V)$ between the acceptor level $E_T$ and the valence band upper end energy $E_V$ of the first nitride semiconductor layer 441. This is because this can also shorten the recovery time for drain current reduced by current collapse.

It is more preferable that the difference $(N_T - N_D)$ between the acceptor density $N_T$ and the donor density $N_D$ of the second nitride semiconductor layer 442 is larger than that of the first nitride semiconductor layer 441, and the difference $(E_T - E_V)$ between the acceptor level $E_T$ and the valence band upper end energy $E_V$ of the second nitride semiconductor layer 442 is smaller than that of the first nitride semiconductor layer 441. This is because this can increase the recovery amount of drain current reduced by current collapse and can also shorten the recovery time for drain current reduced by current collapse.

Although the preferred embodiment of the present invention has been described above, the present invention can also be realized by another preferred embodiment. For example, the above-described semiconductor device 1 in FIG. 1 has the barrier metal film 8 formed on the passivation film 7, however, the barrier metal film 8 need not be formed.

Figure 14:
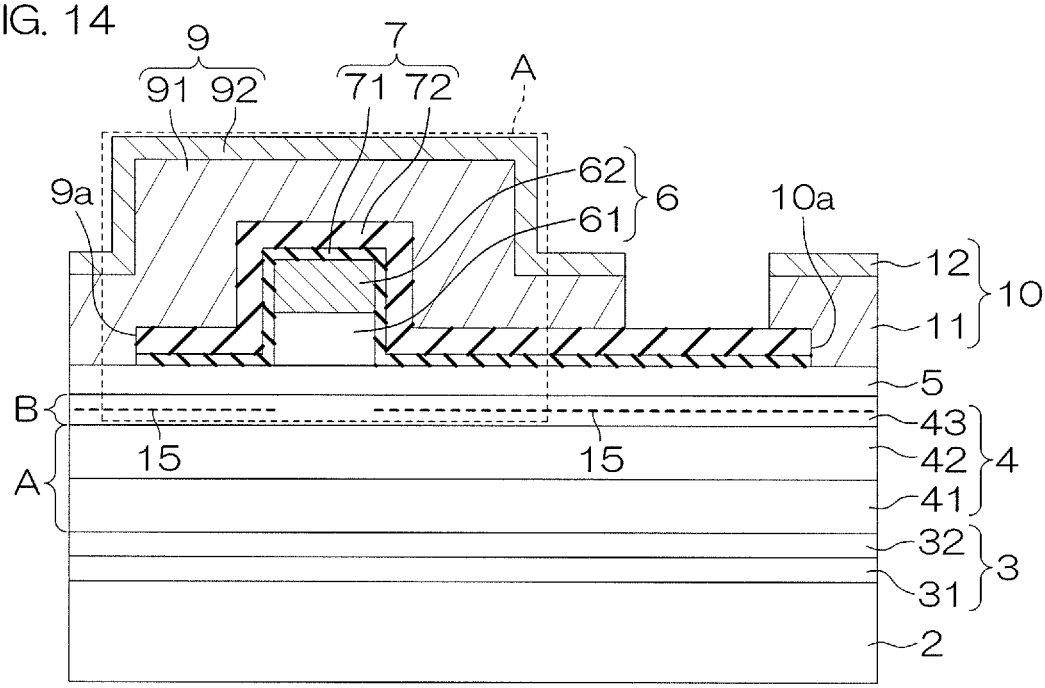
FIG. 14 is a sectional view showing an example of an arrangement in which no barrier metal film is formed in the semiconductor device in FIG. 1.
Figure 15:
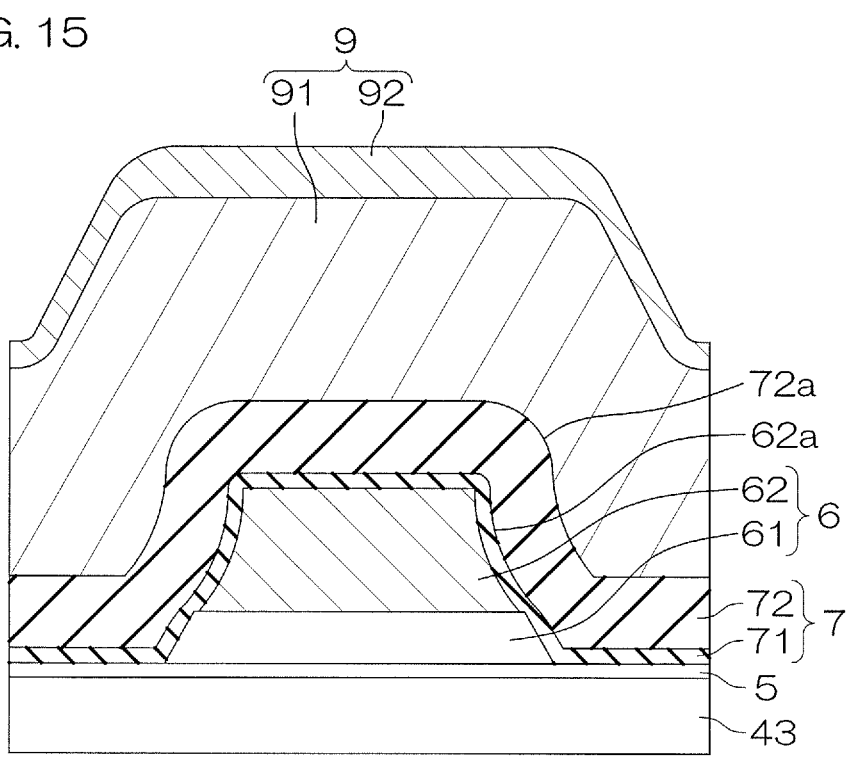
FIG. 15 is a partial enlarged sectional view showing the specific shape of a portion A in FIG. 14.

FIG. 14 is a sectional view showing an example of the arrangement of the semiconductor device 1 in FIG. 1 without the barrier metal film 8. FIG. 15 is a partial enlarged sectional view showing the specific shape of a portion A in FIG. 14. The same reference numerals as in FIG. 14 denote corresponding parts in FIG. 1.

A semiconductor device 501 in FIG. 14 has the same arrangement as that of the semiconductor device 1 in FIG. 1 except that no barrier metal film is formed.

The semiconductor device 501 has no barrier metal film interposed between the passivation film 7 and the source electrode 9 and between the passivation film 7 and the drain electrode 10.

A nitride semiconductor layer 61 has a substantially trapezoidal cross-section. A gate electrode 62 has a substantially trapezoidal cross-section. Both side surfaces 62a of a cross-section of the gate electrode 62 are formed into curved surfaces of a convex shape protruding inward. A gate portion 6 constituted by the nitride semiconductor layer 61 and the gate electrode 62 also has a substantially trapezoidal cross-section.

In this preferred embodiment, a passivation film 7 is constituted by a lower layer 71 covering an electron supply layer 5 and the gate portion 6 and an upper layer 72 laminated on the lower layer 71. The lower layer 71 is formed from a SiN layer formed by low pressure chemical vapor deposition (LPCVD). The upper layer 72 is formed from a SiN layer formed by a plasma CVD method. Both side edge portions 72a of the upper surface of a portion, of the passivation film 7, which covers the gate electrode 62 are formed into curved surfaces of a convex shape protruding outward.

In this preferred embodiment, a source electrode 9 and a drain electrode 10 are respectively constituted by lower layers 91 and 11 in contact with the electron supply layer and upper layers 92 and 12 laminated on the lower layers 91. The lower layers 91 and 11 are formed from Al layers. The upper layers 92 and 12 are formed from TiN layers.

In the semiconductor device 501 in FIG. 14, as in the semiconductor device 1 in FIG. 1, the acceptor density $N_T$ of the first nitride semiconductor layer 41 is preferably larger than the acceptor density $N_T$ of the second nitride semiconductor layer 42. In other words, the difference $(N_T-N_D)$ between the acceptor density $N_T$ and the donor density $N_D$ of the first nitride semiconductor layer 41 is preferably larger than the difference $(N_T-N_D)$ between the acceptor density $N_T$ and the donor density $N_D$ of the second nitride semiconductor layer 42. This is because this can increase the recovery amount of drain current reduced by current collapse.

The difference $(E_T-E_V)$ between the acceptor level $E_T$ and the valence band upper end energy $E_V$ of the first nitride semiconductor layer 41 is preferably smaller than the difference $(E_T-E_V)$ between the acceptor level $E_T$ and the valence band upper end energy $E_V$ of the second nitride semiconductor layer 42. This is because this can also shorten the recovery time for drain current reduced by current collapse.

It is more preferable that the difference $(N_T-N_D)$ between the acceptor density $N_T$ and the donor density $N_D$ of the first nitride semiconductor layer 41 is larger than that of the second nitride semiconductor layer 42, and the difference $(E_T-E_V)$ between the acceptor level $E_T$ and the valence band upper end energy $E_V$ of the first nitride semiconductor layer 41 is smaller than that of the second nitride semiconductor layer 42. This is because this can increase the recovery amount of drain current reduced by current collapse and can also shorten the recovery time for drain current reduced by current collapse.

Examples 1, 2, 3, and 4 can be applied as Examples of the electron transit layer 4 of the semiconductor device 501 in FIG. 14.

In the semiconductor devices 1, 401, and 501 shown in FIGS. 1, 13, and 14, silicon is an example of a material for the substrate 2 in FIG. 1. In addition, other than silicon, an arbitrary substrate material such as a sapphire substrate or GaN substrate can be applied.

Besides the above, various design modifications may be made within the scope of the matters described in the claims.

While preferred embodiments of the present invention are described in detail above, these are merely specific examples used to clarify the technical contents of the present invention. The present invention should not be interpreted as being limited to these specific examples and the scope of the present invention is limited only by the appended claims.

The present application corresponds to Japanese Patent Application No. 2017-222781 filed on Nov. 11, 2017 in the Japan Patent Office, and the entire disclosure of this application is incorporated herein by reference.

REFERENCE SIGNS LIST 1, 401, 501: Semiconductor device
2: Substrate
3: Buffer layer
31: First buffer layer
32: Second buffer layer
4: Electron transit layer
41: First nitride semiconductor layer
42: Second nitride semiconductor layer
43: Third nitride semiconductor layer
5: Electron supply layer
6: Gate portion
61: Nitride semiconductor layer
62: Gate electrode
7: Passivation film
8: Barrier metal film
9: Source electrode
9a: Source electrode contact hole
10: Drain electrode
10a: Drain electrode contact hole
15: Two-dimensional electron gas
21: Gate electrode film
22: Resist film
23: Source-drain electrode film
A: High impurity concentration layer
B: Low impurity concentration layer

The invention claimed is:

1. A semiconductor device comprising a substrate, an electron transit layer disposed on the substrate, and an electron supply layer disposed on the electron supply layer, wherein
the electron transit layer includes a conductive path forming layer in contact with the electron supply layer, a first semiconductor region containing an acceptor-type impurity, and a second semiconductor region disposed at a position closer to the conductive path forming layer than the first semiconductor region and containing an acceptor-type impurity, and
the first semiconductor region has a smaller energy difference between an acceptor level and a valence band upper end than an energy difference between an acceptor level and a valence band upper end of the second semiconductor region.

2. The semiconductor device according to claim 1, wherein the first semiconductor region is disposed on the substrate, and
the second semiconductor region is formed on a front surface of the first semiconductor region which is located on an opposite side to the substrate.

3. The semiconductor device according to claim 1, wherein a two-dimensional electron gas is formed in the conductive path forming layer.

4. The semiconductor device according to claim 1, wherein the first semiconductor region and the second semiconductor region each are made of a semiconductor having a semi-insulating property.

5. The semiconductor device according to claim 1, wherein the first semiconductor region is doped with at least one type of impurity selected from the group consisting of Mg and Zn, and
the second semiconductor region is doped with at least one type of impurity selected from the group consisting of C and Fe.

6. The semiconductor device according to claim 1, wherein the first semiconductor region and the second semiconductor region each are made of a nitride semiconductor, and
the electron supply layer is made of a nitride semiconductor including Al.

7. The semiconductor device according to claim 6, further comprising a source, a gate, and a drain disposed on the electron supply layer,
wherein the substrate is electrically connected to the source.

8. A semiconductor device comprising a substrate, an electron transit layer disposed on the substrate, and an electron supply layer disposed on the electron supply layer, wherein
the electron transit layer includes a conductive path forming layer in contact with the electron supply layer, a first semiconductor region containing an acceptor-type impurity, and a second semiconductor region disposed at a position closer to the conductive path forming layer than the first semiconductor region and containing an acceptor-type impurity, and the first semiconductor region has a higher acceptor density than the second semiconductor region and the first semiconductor region has a smaller energy difference between an acceptor level and a valence band upper end than an energy difference between an acceptor level and a valence band upper end energy of the second semiconductor region.

9. The semiconductor device according to claim 8, wherein the first semiconductor region is disposed on the substrate, and the second semiconductor region is formed on a front surface of the first semiconductor region which is located on an opposite side to the substrate.

10. The semiconductor device according to claim 8, wherein a two-dimensional electron gas is formed in the conductive path forming layer.

11. The semiconductor device according to claim 8, wherein the first semiconductor region and the second semiconductor region each are made of a semiconductor having a semi-insulating property.

12. The semiconductor device according to claim 8, wherein the first semiconductor region is doped with at least one type of impurity selected from the group consisting of Mg and Zn, and the second semiconductor region is doped with at least one type of impurity selected from the group consisting of C and Fe.

13. The semiconductor device according to claim 8, wherein the first semiconductor region and the second semiconductor region each are made of a nitride semiconductor, and the electron supply layer is made of a nitride semiconductor including Al.

14. The semiconductor device according to claim 13, further comprising a source, a gate, and a drain disposed on the electron supply layer, wherein the substrate is electrically connected to the source.

* * * * *